(12) United States Patent
Okada et al.

(10) Patent No.: US 9,463,612 B2  
(45) Date of Patent: Oct. 11, 2016

(54) JOINING METHOD AND JOINING SYSTEM

(75) Inventors: Shinji Okada, Kumamoto (JP); Masatoshi Shiraishi, Kumamoto (JP); Masatoshi Deguchi, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 185 days.

(21) Appl. No.: 14/342,704

(22) PCT Filed: Aug. 30, 2012

(86) PCT No.: PCT/JP2012/071989  
§ 371 (c)(1),  
(2), (4) Date: Mar. 4, 2014

(87) PCT Pub. No.: WO2013/035620  
PCT Pub. Date: Mar. 14, 2013

(65) Prior Publication Data  
US 2014/0224414 A1 Aug. 14, 2014

(30) Foreign Application Priority Data  
Sep. 7, 2011 (JP) .................................. 2011-195448

(51) Int. Cl.  
*C09J 5/00* (2006.01)  
*B32B 38/10* (2006.01)  
(Continued)

(52) U.S. Cl.  
CPC ................ *B32B 38/10* (2013.01); *B32B 37/12* (2013.01); *B32B 38/0012* (2013.01); *C09J 5/00* (2013.01); *H01L 21/6708* (2013.01);  
(Continued)

(58) Field of Classification Search  
CPC .................................. C09J 5/00; B32B 38/00  
USPC .......................................................... 156/154  
See application file for complete search history.

(56) References Cited

U.S. PATENT DOCUMENTS 3,475,867 A * 11/1969 Walsh ..................... B24B 37/27  
118/52  
2005/0269028 A1* 12/2005 Eisenhammer ........... B08B 3/02  
156/281  
(Continued)

FOREIGN PATENT DOCUMENTS

JP 57-174370 A * 10/1982  
JP 2001-189292 A * 7/2001  
(Continued)

OTHER PUBLICATIONS

Machine translation of JP 2001-189292, date unknown.*  
(Continued)

*Primary Examiner* — Jeff Aftergut  
(74) *Attorney, Agent, or Firm* — Nath, Goldberg & Meyer; Jerald L. Meyer

(57) ABSTRACT

The present disclosure is a joining method that joins a target substrate and a support substrate, wherein the method has: a joining operation that includes pressing and joining the target substrate and the support substrate by interposing an adhesive therebetween; and an adhesive removing operation that includes supplying a solvent of the adhesive to the outer adhesive that is the adhesive between the target substrate and the support substrate protruding in the joining operation from the outer lateral surface of the stacked substrate made by joining the target substrate and the support substrate, and to remove the surface of the outer adhesive so that the outer adhesive is formed at a predetermined size.

9 Claims, 25 Drawing Sheets

(51) Int. Cl.
*H01L 21/67* (2006.01)
*H01L 21/687* (2006.01)
*H01L 21/683* (2006.01)
*B32B 38/00* (2006.01)
*B32B 37/12* (2006.01)

(52) U.S. Cl.
CPC .... *H01L 21/6715* (2013.01); *H01L 21/67092* (2013.01); *H01L 21/6835* (2013.01); *H01L 21/68707* (2013.01); *B32B 2457/14* (2013.01); *H01L 2221/6834* (2013.01); *H01L 2221/68327* (2013.01); *Y10T 156/14* (2015.01)

(56) References Cited

U.S. PATENT DOCUMENTS

2005/0275092 A1* 12/2005 Yamaguchi ........... H01L 21/304
257/734

2011/0151176 A1* 6/2011 Akiyama ............ H01L 21/6835
428/78
2013/0228920 A1* 9/2013 Chiou ................... H01L 21/561
257/737

FOREIGN PATENT DOCUMENTS

| JP | 2006-518097 A |   | 8/2006 |
|----|---------------|---|--------|
| JP | 2007-142381 A |   | 6/2007 |
| JP | 2007-142381 A | * | 6/2007 |
| JP | 2008-182016 A |   | 8/2008 |
| JP | 2009-188036 A |   | 8/2009 |

OTHER PUBLICATIONS

International Search Report in Japanese Application No. PCT/JP2012/071989 dated Sep. 28, 2012, one page.

* cited by examiner

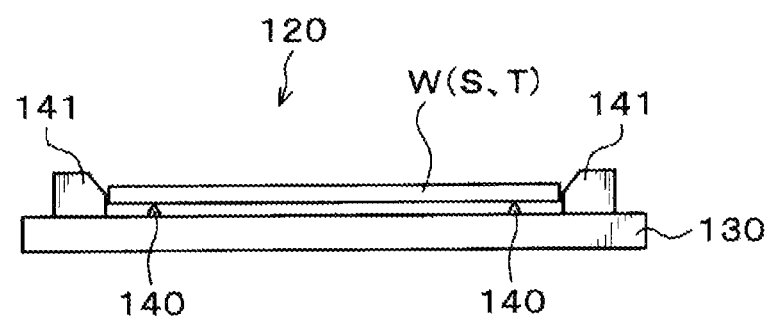
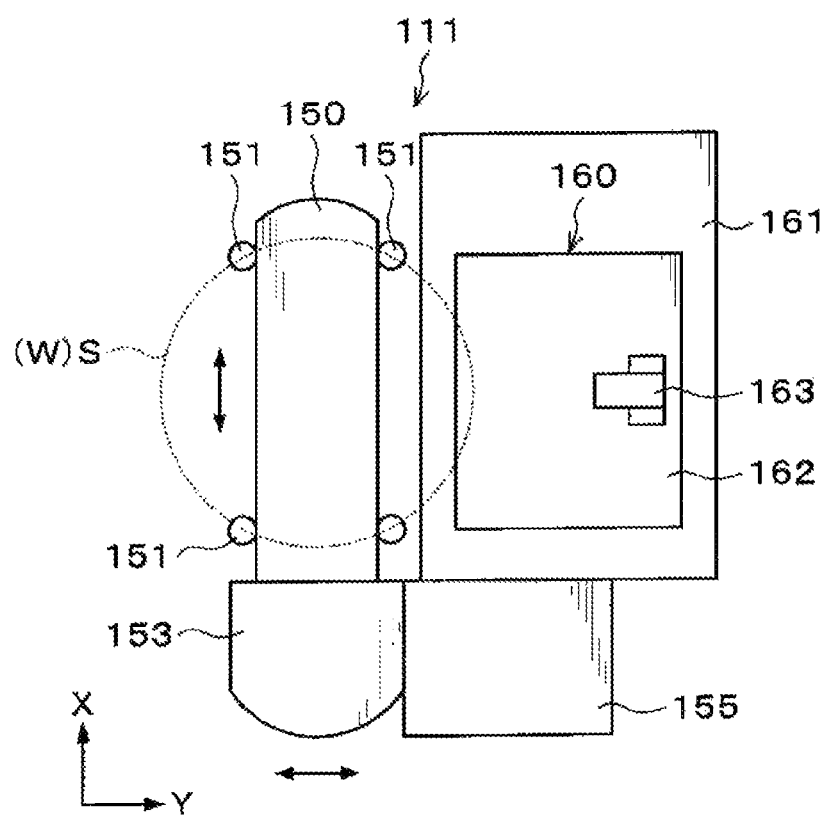

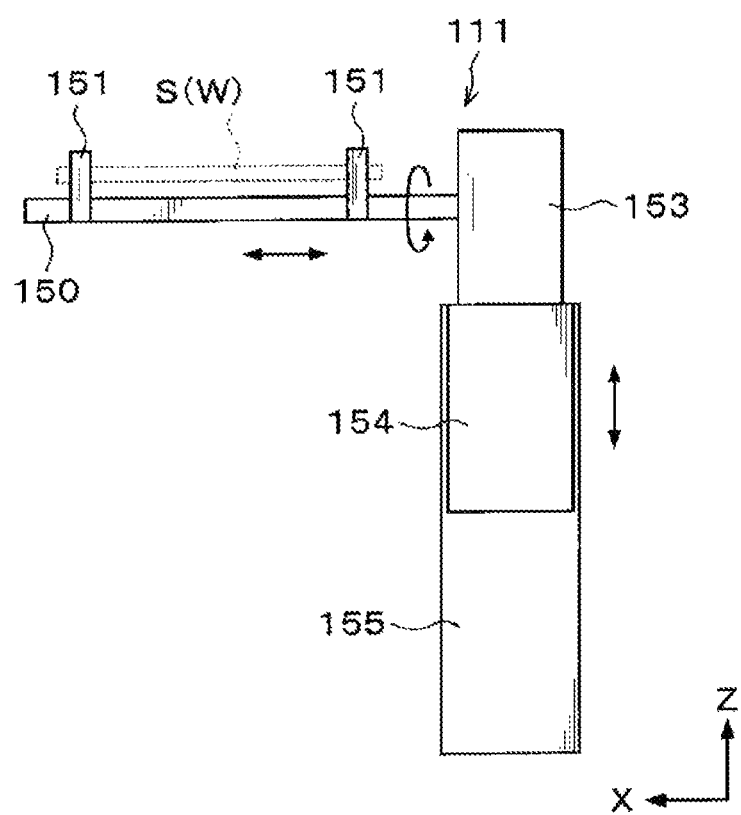

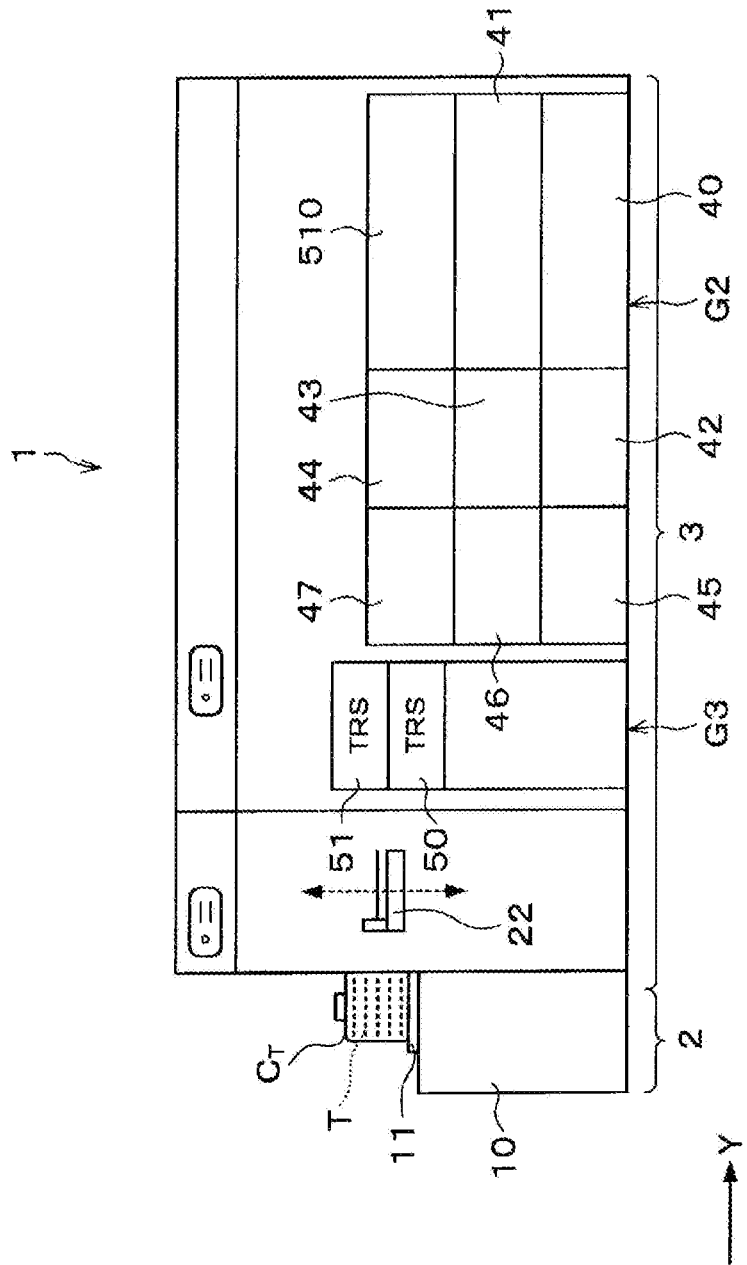

JOINING METHOD AND JOINING SYSTEM

CROSS-REFERENCE TO RELATED APPLICATION

This application is a 35 U.S.C. §371 National Phase Entry Application from PCT/JP2012/071989, filed on Aug. 30, 2012, which claims the benefit of Japanese Patent Application No. 2011-195448, filed on Sep. 7, 2011, in the Japanese Patent Office, the disclosure of which is incorporated herein in their entirety by reference.

TECHNICAL FIELD

The present disclosure generally relates to a method of joining a target substrate and a support substrate, and a joining system for performing the joining method.

BACKGROUND

Recently, semiconductor wafers (hereinafter, referred to as "wafers") having large diameters are currently being developed, for example, in a process of manufacturing a semiconductor device. Also, thinner wafers are in demand for process such as mounting or the like. For example, if a thin wafer with a large diameter is transferred or polished as it is, there is a possibility that the wafer is warped or cracked. Therefore, in order to reinforce the wafer, the wafer is joined to, for example, a wafer or a glass substrate, which is a support substrate.

Joining of such wafer and the support substrate is performed by interposing an adhesive between the wafer and the support substrate, for example, using a joining apparatus. The joining apparatus has, for example, a first holding member configured to hold the wafer, a second holding member configured to hold the support substrate, a heating mechanism configured to heat the adhesive arranged between the wafer and the support substrate, and a moving mechanism configured to move at least the first holding member or the second holding member in a vertical direction. Also, in the joining apparatus, after supplying the adhesive between the wafer and the support substrate and heating the adhesive, the wafer and the support substrate are pressed and thus joined together.

SUMMARY

When the joining apparatus is used, if the wafer and the support substrate are pressed, the adhesive protrudes out from between the wafer and the support substrate. The protruding adhesive may adversely affect a transfer process or a processing process of the wafer and the support substrate. For example, in the transfer process, if the adhesive is stuck to a transfer device for transferring the wafer and support substrate, the adhesive may be stuck to another wafer or support substrate. In addition, when a processing process is performed, there may be case that the adhesive may be stuck to a processing device for performing predetermined processing on a wafer and a support substrate. In such cases, the wafer and the support substrate cannot be suitably joined.

The present disclosure addresses the above points. In some embodiments of the disclosure an adhesive is prevented from protruding from a gap between a target substrate and a support substrate to appropriately join the target substrate and the support substrate.

According to one embodiment of the present disclosure, there is provided a method of joining a target substrate and a support substrate, the method including: a joining operation that includes pressing and joining the target substrate and the support substrate by interposing an adhesive; and an adhesive removing operation that includes supplying a solvent of the adhesive to an outside adhesive that is the adhesive between the target substrate and the support substrate protruding in the joining operation from an outer lateral side of a stacked substrate made by joining the target substrate and the support substrate, to remove a surface of the outside adhesive so that the outside adhesive is formed to have a predetermined size.

According to the present disclosure, after the target substrate and the support substrate are joined to each other in the joining operation, the surface of the outside adhesive protruding from the outer lateral side of the stacked substrate is removed in the adhesive removing operation, and the outside adhesive is formed to have the predetermined size. In such a case, the outside adhesive is not stuck to a transfer device configured to transfer the target substrate, the support substrate and the stacked substrate or processing devices configured to perform predetermined processing on these substrates. Therefore, it is possible to prevent the adhesive from protruding from a gap between the target substrate and the support substrate, thereby appropriately joining the target substrate and the support substrate to each other.

According to another aspect of the present disclosure, there is provided a joining system of joining a target substrate and a support substrate, including: a joining device configured to press and join the target substrate and the support substrate by interposing an adhesive; and an adhesive removal device having a solvent supply unit configured to supply a solvent of the adhesive to an outside adhesive, which the adhesive between the target substrate and the support substrate protrudes from an outer lateral side of an stacked substrate made by joining the target substrate and the support substrate, wherein the adhesive removal device is configured to remove a surface of the outside adhesive so that the outside adhesive is formed to have a predetermined size by the solvent of the adhesive supplied from the solvent supply unit.

According to some embodiments of the present disclosure, an adhesive is prevented from protruding from between a target substrate, and a support substrate can be suppressed to thereby appropriately join the target substrate and the support substrate.

BRIEF DESCRIPTION OF THE DRAWINGS

FIG. 7 is a side view schematically showing a configuration of a delivery arm.

FIG. 8 is a plan view schematically showing a configuration of a reversing unit.

FIG. 9 is a side view schematically showing the configuration of a reversing unit.

FIG. 41 is a side view schematically showing an internal configuration of a joining system according to another embodiment.

DETAILED DESCRIPTION

Figure 1:
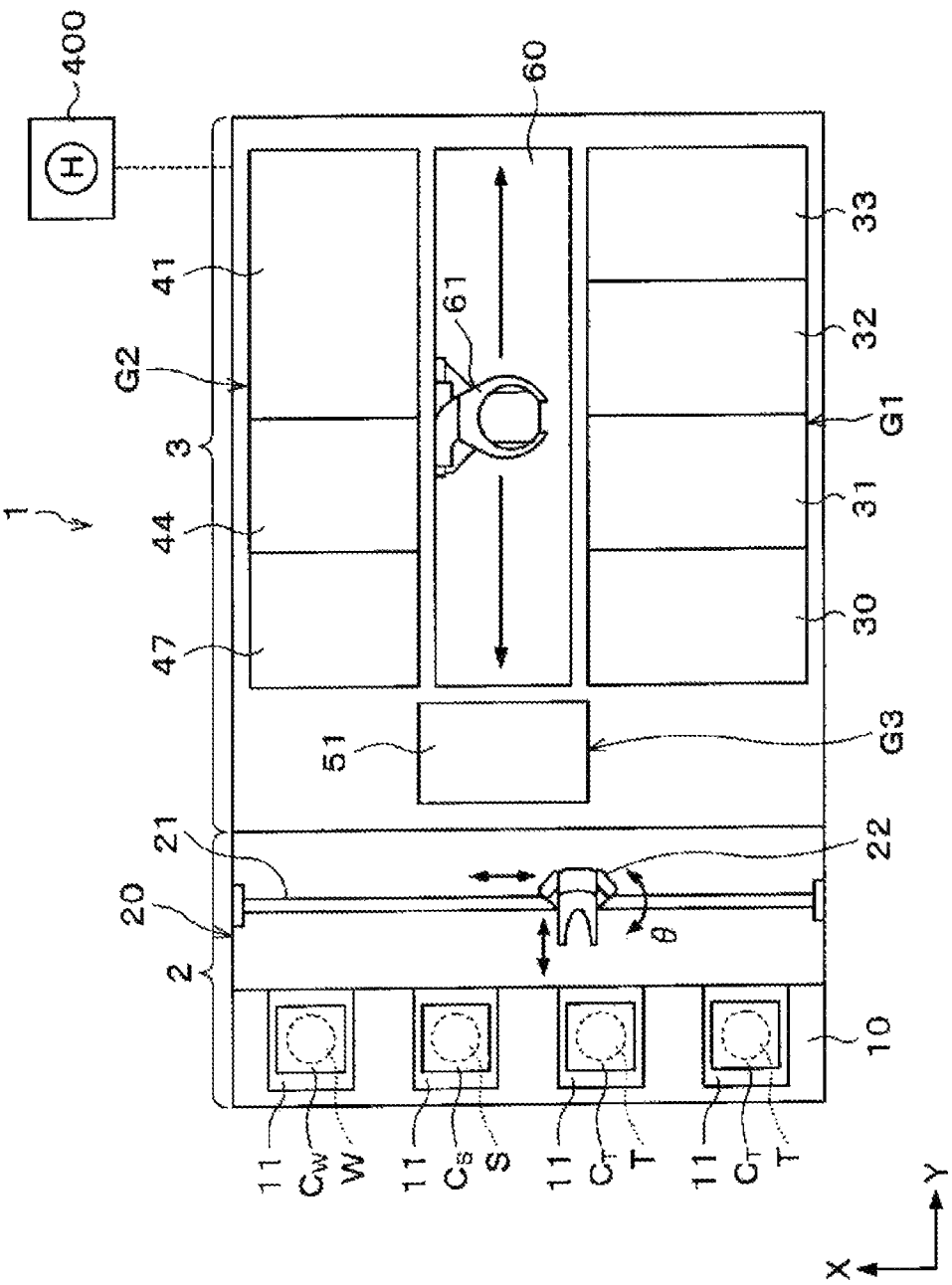
FIG. 1 is a plan view schematically showing a configuration of a joining system according to an embodiment.
Figure 2:
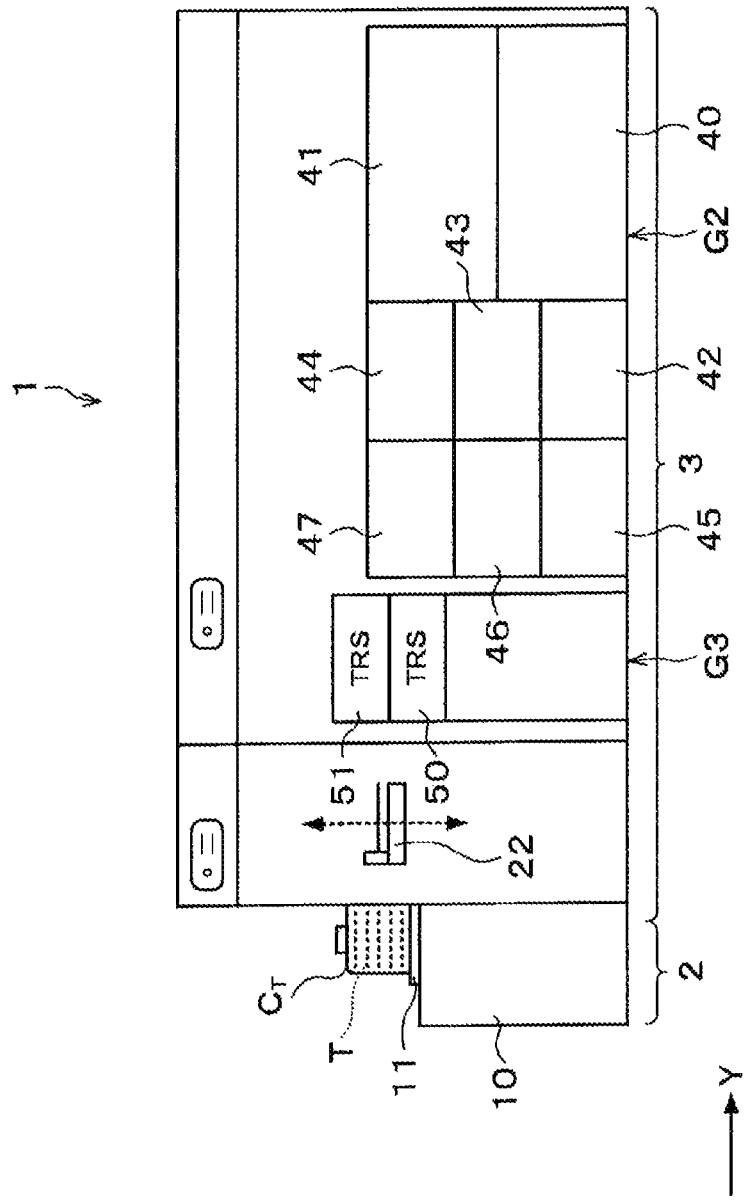
FIG. 2 is a side view schematically showing an internal configuration of the joining system according to an embodiment.

Hereinafter, an embodiment of the present disclosure will be described. FIG. 1 is a plan view schematically showing a configuration of a joining system 1 according to an embodiment. FIG. 2 is a side view schematically showing an internal configuration of the joining system 1.

Figure 3:
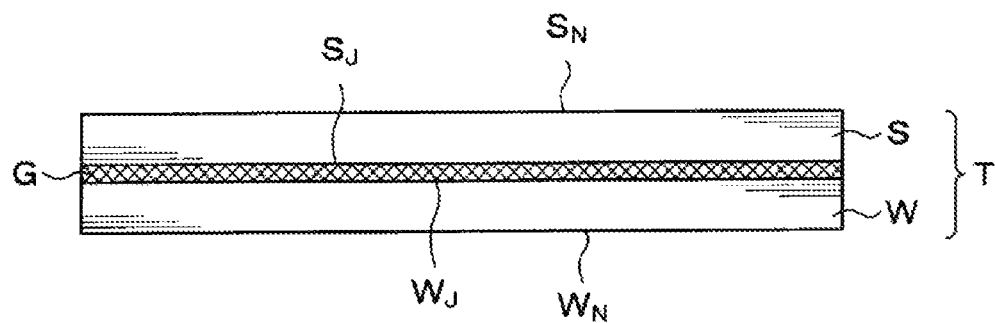
FIG. 3 is a side view of a target wafer and a support wafer.

As shown in FIG. 3, the joining system 1 is configured to, for example, interpose an adhesive to join a target wafer W, which is a substrate to be processed, and a support wafer S, which is a support substrate. Hereinafter, in the target wafer W, a surface of the target wafer W, which is joined to the support wafer S by interposing the adhesive G, will be referred to as a "joint surface $W_J$" as a front surface, and a surface of the target wafer W, which is opposite to the joint surface $W_J$, will be referred to as a "non-joint surface $W_N$" as a rear surface. In the same way, a surface of the support wafer S to be joined to the target wafer W by interposing the adhesive G will be referred to as a "joint surface $S_J$" as a front surface, and a surface of the support wafer S, which is opposite to the joint surface $S_J$, will be referred to as a "non-joint surface $S_N$" as a rear surface. Also, in the joining system 1, the target wafer W and the support wafer S are joined to thereby form a stacked substrate T. In addition, the target wafer W is a wafer that will be the final product. A plurality of electronic circuits is formed on, for example, the joint surface $W_J$, and the non-joint surface $W_N$ is subjected to a polishing process. In addition, the support wafer S has an identical diameter to that of the target wafer W and supports the target wafer. While it has been described in this embodiment that the wafer is used as the support substrate, another substrate such as a glass substrate or the like may be used as the support substrate.

As shown in FIG. 1, the joining system 1 includes a carry-in/carry-out station 2 in which cassettes $C_W$, $C_S$ and $C_T$ capable of accommodating a plurality of target wafers W, a plurality of support wafers S and a plurality of stacked wafers T, respectively, are carried in and out, for example, between the carry-in/carry-out station 2 and the outside, and a processing station 3 including various processing units configured to perform predetermined processes on the target wafer W, the support wafer S and the stacked wafer T. These stations 2 and 3 are connected integrally.

A cassette mounting table 10 is installed in the carry-in/carry-out station 2. A plurality of, for example, four, cassette mounting plates 11 are installed on the cassette mounting table 10. The cassette mounting plates 11 are arranged in a line along an X direction (vertical direction in FIG. 1). The cassettes $C_W$, $C_S$ and $C_T$ are mounted on the cassette mounting plates 11 when carried in and out between the carry-in/carry-out station 2 and the outside of the joining system 1. In this way, the carry-in/carry-out station 2 is configured to be able to hold the plurality of target wafers, the plurality of support wafers S, and the plurality of stacked wafers T. In addition, the number of the cassette mounting plates 11 is not limited to that of this embodiment but may be arbitrarily determined. Further, one of the cassettes may be used for collecting problematic wafers. That is, this cassette is to separate a stacked wafer, in which a problem occurs in joining of the target wafer W and the support wafer S because of various factors, from the other normal stacked wafers T. In the embodiment, one of the cassettes $C_T$ is used for collecting problematic wafers and the other cassettes $C_T$ are used for accommodating normal stacked wafers T therein.

A wafer transfer unit 20 is installed in the vicinity of the cassette mounting table 10 in the carry-in/carry-out station 2. The wafer transfer unit 20 is provided with a wafer transfer device 22, which is movable on a transfer path 21 extending in an X direction. The wafer transfer device 22 is movable about the vertical axis (in a θ direction) and in a vertical direction, and can transfer the target wafer W, the support wafer S or the stacked wafer T between the cassettes $C_W$, $C_S$ and $C_T$ on the cassette mounting plates 11 and transition devices 50 and 51 of a third processing block G3 of the processing station 3, which will be described later.

The processing station 3 is provided with a plurality of, for example, three, processing blocks G1, G2 and G3 having various processing devices. For example, the first processing block G1 is installed at a front side of the processing station 3 (at a negative direction side of the X direction in FIG. 1), and the second processing block G2 is installed at the back side of the processing station 3 (at a positive direction side of the X direction in FIG. 1). In addition, the third processing block G3 is installed at a side of the carry-in/carry-out station 2 (at a negative direction side of the Y direction in FIG. 1) in the processing station 3.

For example, joining devices 30 to 33, which are configured to press the target wafer W and the support wafer S with the adhesive G interposed therebetween for joining thereof, are disposed in an order in the Y direction from the side of the carry-in/carry-out station 2 in the first processing block G1.

For example, as shown in FIG. 2, a coating device 40 configured to coat the target wafer W with the adhesive G, and an adhesive removal device 41 configured to supply a solvent of the adhesive G to an outside adhesive protruding from an outer lateral side of the stacked wafer T, which will be described later to remove a surface of the outside adhesive such that the outside adhesive is formed to have a predetermined size are stacked in the second processing block G2 in a two-stage manner in this order from the bottom in a vertical direction. In addition, heat processing devices 42 to 44 configured to heat the target wafer W coated with the adhesive G at a predetermined temperature, and heat processing devices 45 to 47 similar thereto are arranged and disposed in this order toward the carry-in/carry-out station 2 at a side of the coating device 40 and the adhesive removal device 41 facing the carry-in/carry-out station 2 (at a negative direction side of Y direction in FIG. 2) in the second processing block G2. The heat processing devices 42 to 44 or the heat processing devices 45 to 47 are stacked in a three-stage manner in this order from the bottom in a vertical direction. In addition, the number of the heat processing devices 42 to 47 or the arrangement thereof in the vertical direction and the horizontal direction may be arbitrarily set.

For example, the transition devices 50 and 51 of the target wafer W, the support wafer S and the stacked wafer T may be stacked in the third processing block G3 in a two-stage manner in this order from the bottom in a vertical direction.

As shown in FIG. 1, a wafer transfer region 60 is defined in a region surrounded by the first processing block G1 to the third processing block G3. A wafer transfer device 61 is arranged in, for example, the wafer transfer region 60. In addition, a pressure in the wafer transfer region 60 is equal to or greater than atmospheric pressure, and so-called atmosphere transfer of the target wafer W, the support wafer S or the stacked wafer T is performed in the wafer transfer region 60.

The wafer transfer device 61 is provided with a transfer arm, which is movable, for example, in a vertical direction and a horizontal direction (Y and X directions) and around the vertical axis. The wafer transfer device 61 may move inside the wafer transfer region 60 to transfer the target wafer W, the support wafer S and the stacked wafer T to predetermined devices in the first processing block G1, the second processing block G2 and the third processing block G3 positioned in the vicinity thereof.

Figure 4:
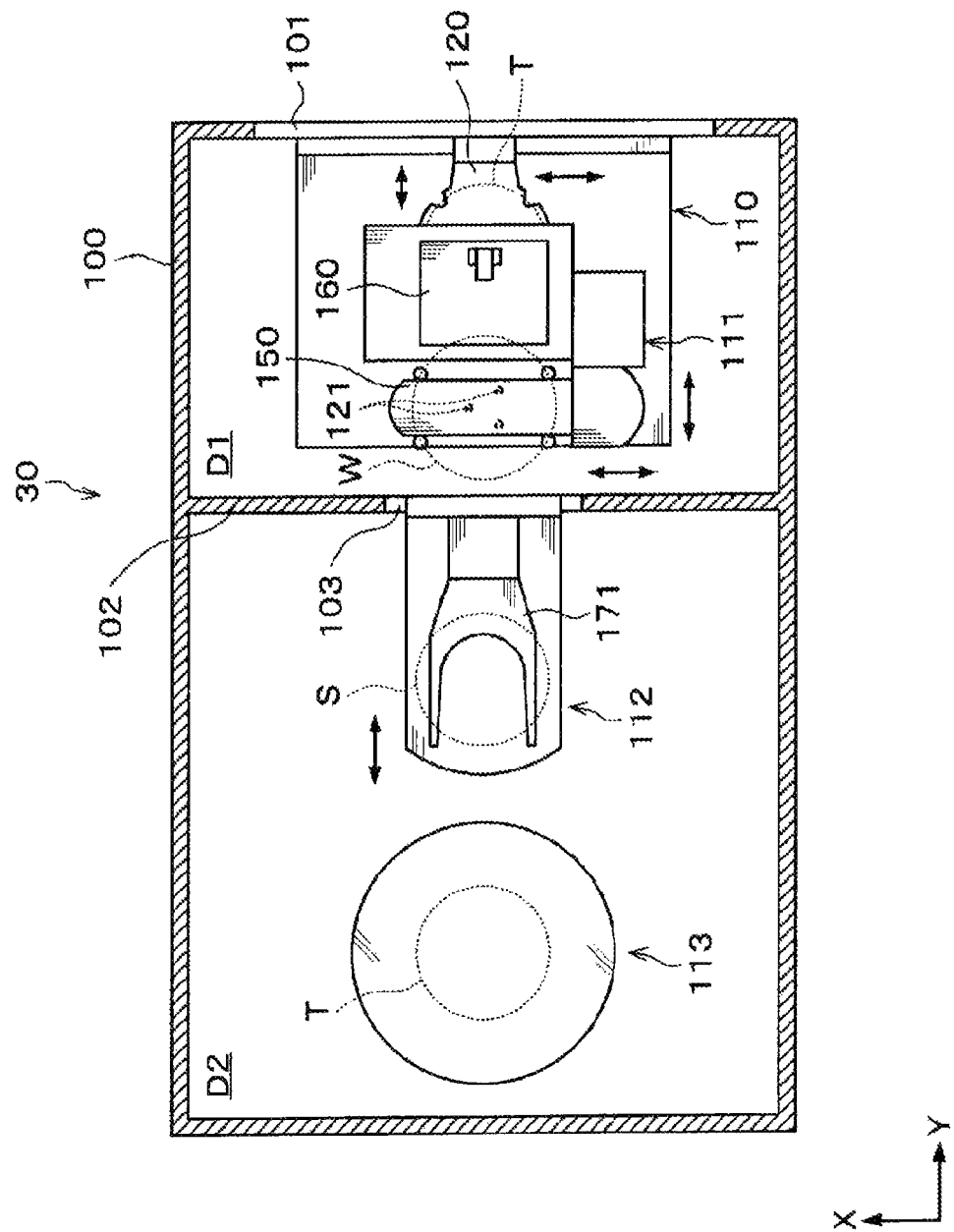
FIG. 4 is a transverse sectional view schematically showing a configuration of a joining device.

Subsequently, a configuration of the above-described joining devices 30 to 33 will be described. As shown in FIG. 4, the joining device 30 has a pressing vessel 100 capable of sealing an inside thereof. An inlet/outlet 101 for transfer of the target wafer W, the support wafer S and the stacked wafer T is formed in a lateral side of the processing vessel 100 facing the wafer transfer region 60, and an opening/closing shutter (not shown) is installed at the inlet/outlet.

The interior of the processing vessel 100 is partitioned into a preprocessing region D1 and a joining region D2 by an inner wall 102. The above-described inlet/outlet 101 is formed in the lateral side of the processing vessel 100 in the preprocessing region D1. In addition, an inlet/outlet 103 for transfer of the target wafer W, the support wafer S and the stacked wafer T is formed in the inner wall 102.

The preprocessing region D1 is provided with delivery units 110 configured to deliver the target wafer W, the support wafer S and the stacked wafer T between the preprocessing region D1 and the outside of the joining device 30. The delivery units 110 are arranged adjacent to the inlet/outlet 101. In addition, as described later, the delivery units 110 are arranged in a multi-stage manner, for example, a two-stage manner, in a vertical direction, and thus can simultaneously deliver any two of the target wafer W, the support wafer S and the stacked wafer T. For example, one of the delivery units 110 may deliver the target wafer W or the support wafer S before being joined, and the other delivery unit 110 may deliver the stacked wafer T after joining. Alternatively, one of the delivery units 110 may deliver the target wafer W before being joined, and the other delivery unit 110 may deliver support wafer S before being joined.

A reversing unit 111 configured to reverse the front and rear surfaces of, e.g., the support wafer S, is installed vertically above the delivery units 110 at a negative direction side of the Y direction, i.e., toward the inlet/outlet 103, in the preprocessing region D1. In addition, as described later, the reversing unit 111 may adjust an orientation of a horizontal direction of the support wafer S and also adjust an orientation of a horizontal direction of the target wafer W.

A transfer unit 112, which is configured to transfer the target wafer W, the support wafer S or the stacked wafer T between the delivery units 110, the reversing unit 111 and a later-described joining unit 113, is installed at a positive direction side of the Y direction in the joining region D2. The transfer unit 112 is installed at the inlet/outlet 103.

The joining unit 113, which is configured to interpose the adhesive G and press the target wafer W and the support wafer S for joining, is installed at a negative direction side of the Y direction in the joining region D2.

Figure 5:
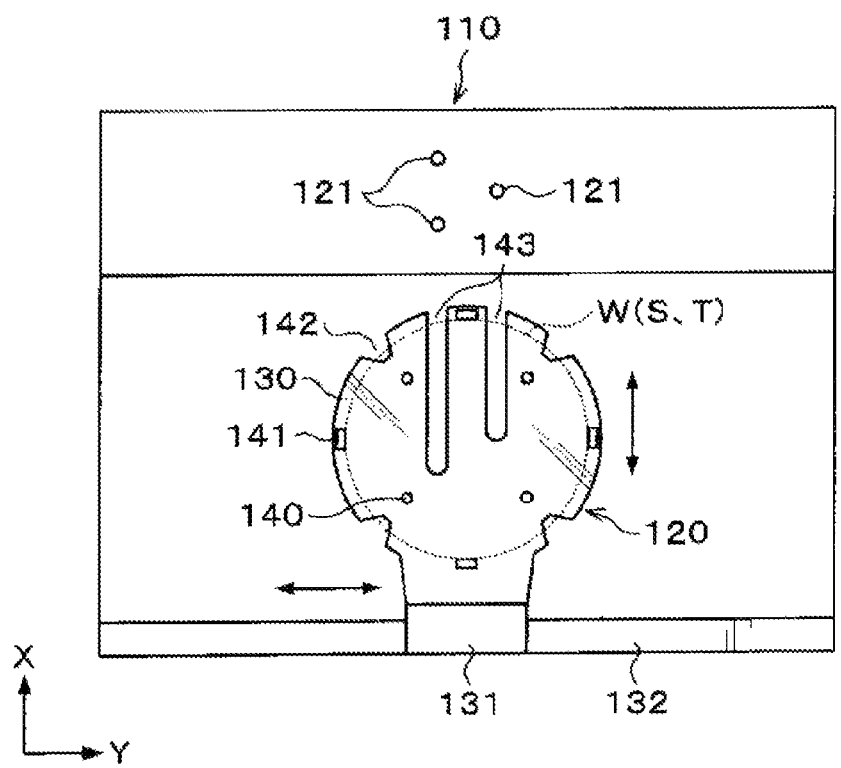
FIG. 5 is a plan view schematically showing a configuration of a delivery unit.

Subsequently, a configuration of the above-described delivery unit 110 will be described. The delivery unit 110 has a delivery arm 120 and wafer support pins 121, as shown in FIG. 5. The delivery arm 120 may deliver the target wafer W, the support wafer S or the stacked wafer T between the outside of the joining device 30, i.e., the wafer transfer device 61, and the wafer support pins 121. The wafer support pins 121 are installed at a plurality of, for example, three, places and may support the target wafer W, the support wafer S or the stacked wafer T.

The delivery arm 120 includes an arm portion 130 configured to hold the target wafer W, the support wafer S or the stacked wafer T, and an arm drive part 131 having, for example, a motor or the like. The arm portion 130 has a substantially circular plate shape. The arm drive part 131 may move the arm portion 130 in an X direction (vertical direction in FIG. 5). In addition, the arm drive part 131 is installed on a rail 132 extending in a Y direction (left and right directions in FIG. 5) and configured to be movable on the rail 132. With such a configuration, the delivery arm 120 is movable in a horizontal direction (X and Y directions) and may deliver the target wafer W, the support wafer S or the stacked wafer T smoothly between the wafer transfer device 61 and the wafer support pins 121.

Figure 6:
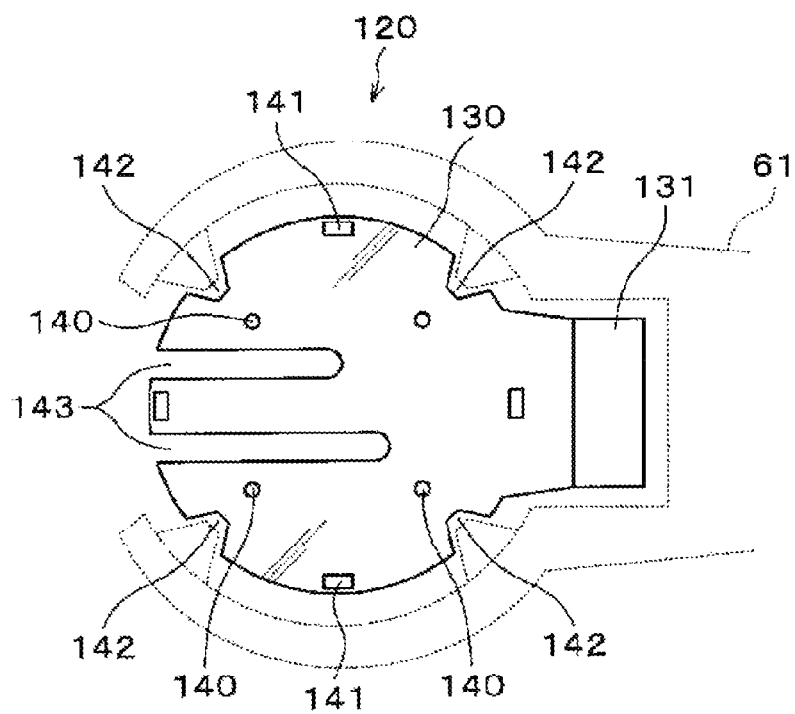
FIG. 6 is a plan view schematically showing a configuration of a delivery arm.

Wafer support pins 140, which are configured to support the target wafer W, the support wafer S or the stacked wafer T, are installed at a plurality of, for example, four, places on the arm portion 130, as shown in FIGS. 6 and 7. In addition, guides 141, which are configured to perform positioning of the target wafer W, the support wafer S or the stacked wafer T supported by the wafer support pins 140, are installed on the arm portion 130. The guides 141 are installed at a plurality of, for example, four, places in order to guide a lateral side of the target wafer W, the support wafer S or the stacked wafer T.

Cutouts 142 are formed at, for example, four places in the outer periphery of the arm portion 130, as shown in FIGS. 5 and 6. The cutouts 142 may prevent the transfer arm of the wafer transfer device 61 from interfering with the arm portion 130 when the target wafer W, the support wafer S or the stacked wafer T is delivered from the transfer arm of the wafer transfer device 61 to the delivery arm 120.

The arm portion 130 is formed with two slits 143 along the X direction. Each of the slits 143 is formed from the end of the arm portion 130, which faces the wafer support pins 121, to the vicinity of the central portion of the arm portion 130. The slits 143 may prevent the arm portion 130 from interfering with the wafer support pins 121.

Figure 10:
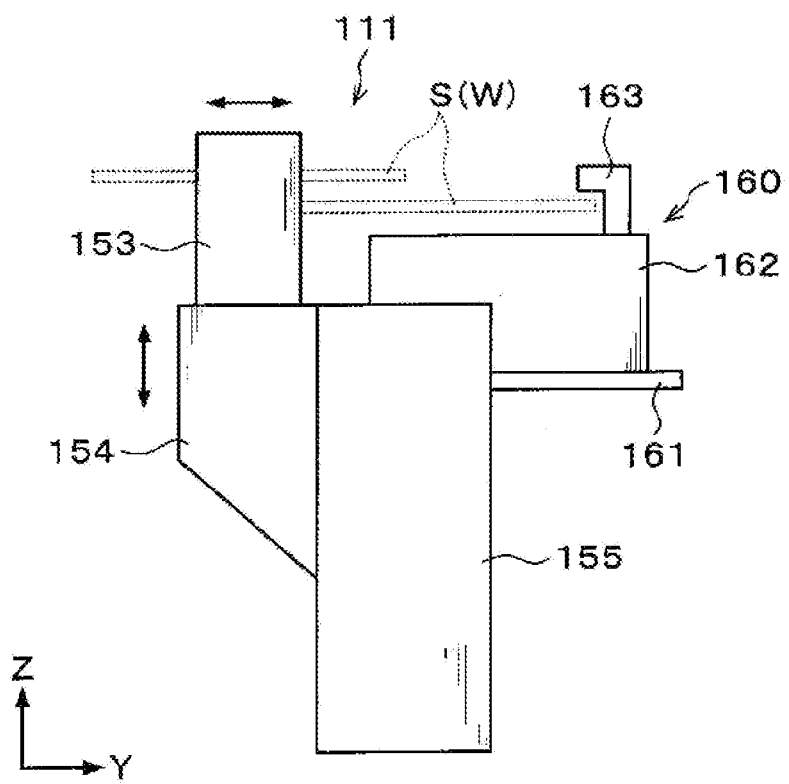
FIG. 10 is a side view schematically showing the configuration of a reversing unit.
Figure 11:
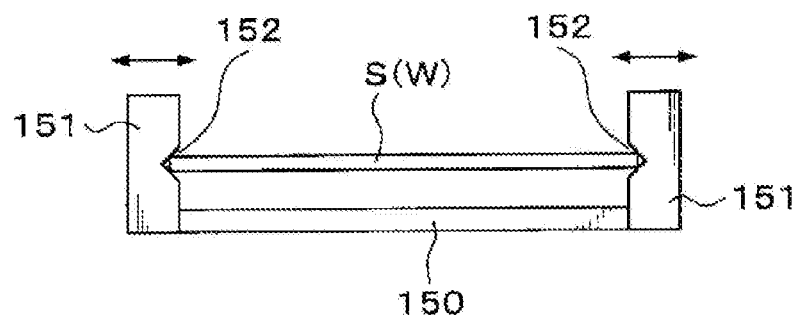
FIG. 11 is a side view schematically showing a configuration of a holding arm and holding members.

Next, a configuration of the above-described reversing unit 111 will be described. As shown in FIGS. 8 to 10, the reversing unit 111 has a holding arm 150 configured to hold the support wafer S or the target wafer W. The holding arm 150 extends in a horizontal direction (X direction in FIGS. 8 and 9). In addition, holding members 151, which are configured to hold the support wafer S or the target wafer W, are installed at, for example, four places in the holding arm 150. The holding members 151 are configured to be movable in a horizontal direction with respect to the holding arm 150, as shown in FIG. 11. In addition, lateral sides of the holding members 151 are respectively formed with cutouts 152 configured to hold an outer peripheral portion of the support wafer S or the target wafer W. Also, the holding members 151 may allow the support wafer S or the target wafer W to be inserted therebetween, thereby holding the support wafer S or the target wafer W.

As shown in FIGS. 8 to 10, the holding arm 150 is supported by a first drive unit 153 having, for example, a motor or the like. The first drive unit 153 allows the holding arm 150 to be rotatable about a horizontal axis and also to be movable in a horizontal direction (X direction in FIGS. 8 and 9 and Y direction in FIGS. 8 and 10). In addition, the first drive unit 153 may rotate the holding arm 150 about a vertical axis, thereby moving the holding arm 150 in a horizontal direction. A second drive unit 154 having, for example, a motor or the like, is installed below the first drive unit 153. The second drive unit 154 enables the first drive unit 153 to move in a vertical direction along a support post 155 extending in the vertical direction. In this way, with the first drive unit 153 and the second drive unit 154, the support wafer S or the target wafer W held by the holding members 151 can be rotated about the horizontal axis and moved in vertical and horizontal directions.

A position adjustment mechanism 160, which is configured to adjust an orientation of the horizontal direction of the support wafer S or the target wafer W held by the holding members 151, is supported by the support post 155 via a support plate 161. The position adjustment mechanism 160 is installed adjacent to the holding arm 150.

The position adjustment mechanism 160 has a base 162 and a detection unit 163 configured to detect a position of a notch portion of the support wafer S or the target wafer W. In addition, while moving the support wafer S or the target wafer W held by the holding members 151 in the horizontal direction, the position adjustment mechanism 160 detects the position of the notch portion of the support wafer S or the target wafer W by the detection unit 163, so that the position adjustment mechanism 160 may control the position of the notch portion to thereby control the orientation of the horizontal direction of the support wafer S or the target wafer W.

Figure 12:
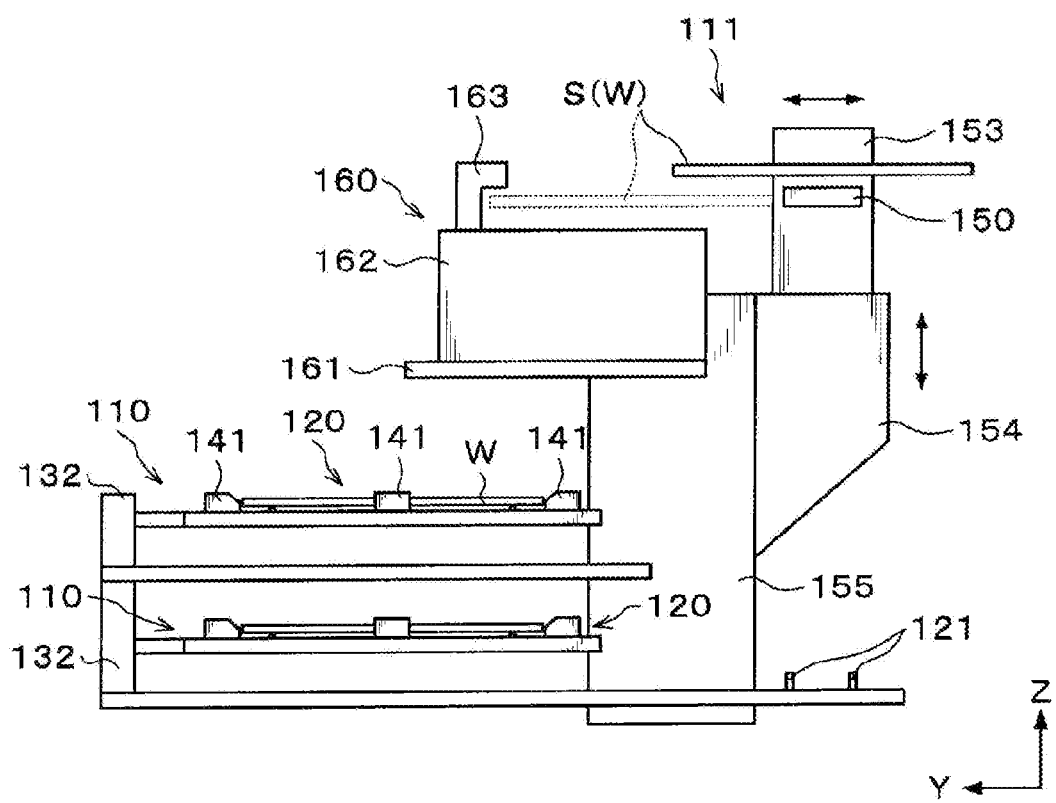
FIG. 12 is an explanatory view illustrating a positional relationship between a delivery unit and a reversing unit.

In addition, as shown in FIG. 12, the delivery units 110 as configured above are arranged in a two-stage manner in a vertical direction, and the reversing unit 111 is disposed vertically above the delivery units 110. That is, the delivery arm 120 of the delivery unit 110 moves in a horizontal direction below the holding arm 150 of the reversing unit 111 and the position adjustment mechanism 160. In addition, the wafer support pins 121 of the delivery unit 110 are arranged below the holding arm 150 of the reversing unit 111.

Figure 13:
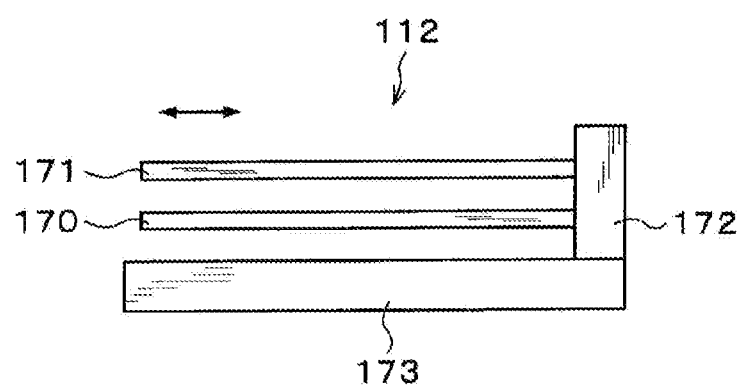
FIG. 13 is a side view schematically showing a configuration of a transfer unit.

Subsequently, a configuration of the above-described transfer unit 112 will be described. As shown in FIG. 13, the transfer unit 112 has a plurality of, for example, two, transfer arms 170 and 171. The first transfer arm 170 and the second transfer arm 171 are arranged in a two-stage manner in order from the bottom in a vertical direction. In addition, the first transfer arm 170 and the second transfer arm 171 have different shapes from each other as described later.

An arm drive part 172 having, for example, a motor or the like, is installed at base end portions of the transfer arms 170 and 171. The respective transfer arms 170 and 171 may be independently moved in a horizontal direction by the arm drive part 172. These transfer arms 170 and 171 and the arm drive part 172 are supported by a base 173.

Figure 14:
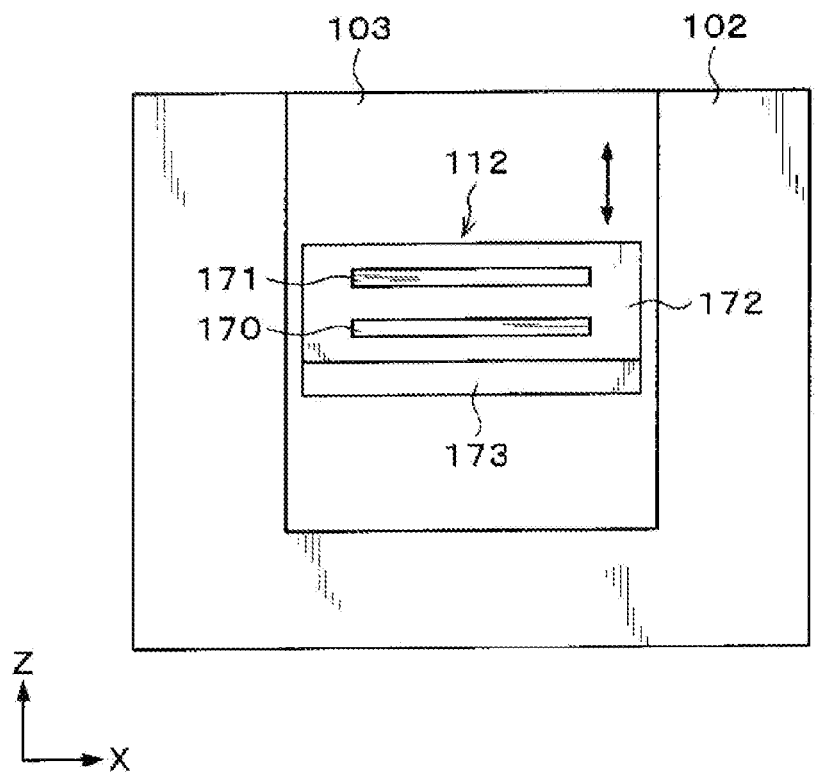
FIG. 14 is an explanatory view illustrating a transfer unit arranged in a joining device.

As shown in FIGS. 4 and 14, the transfer unit 112 is installed at the inlet/outlet 103 formed in the inner wall 102 of the processing vessel 100. In addition, the transfer unit 112 is movable along the inlet/outlet 103 in a vertical direction by a drive unit (not shown) having, for example, a motor or the like.

Figure 15:
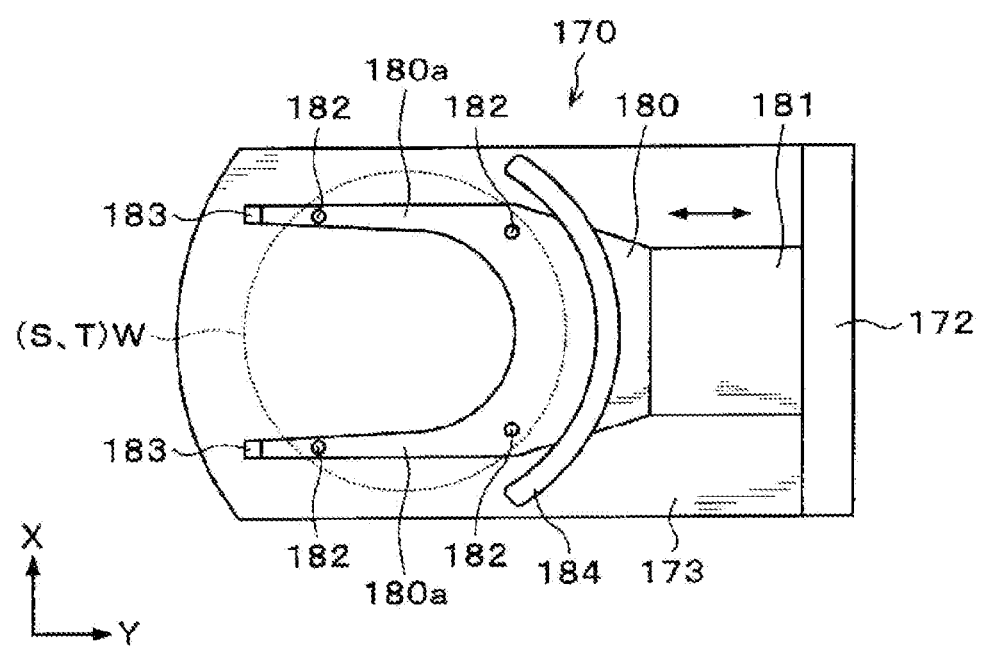
FIG. 15 is a plan view schematically showing a configuration of a first transfer arm.

The first transfer arm 170 holds the rear surface of the target wafer W, the support wafer S or the stacked wafer T (i.e., the non-joint surface $W_N$ or $S_N$ of the target wafer W or the support wafer S) for transfer. As shown in FIG. 15, the first transfer arm 170 includes an arm portion 180, in which a distal end branches into two tip portions 180a, and a support portion 181, which is formed integrally with the arm portion 180 and supports the arm portion 180.

Figure 16:
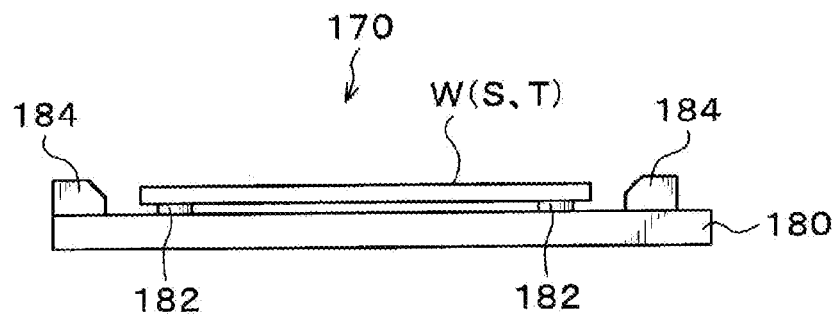
FIG. 16 is a side view schematically showing a configuration of a first transfer arm.

As shown in FIGS. 15 and 16, O-rings 182 are installed at a plurality of, for example, four places on the arm portion 180. The O-rings 182 make contact with the rear surface of the target wafer W, the support wafer S or the stacked wafer T, and the O-rings 182 hold the rear surface of the target wafer W, the support wafer S or the stacked wafer T by the friction force between the O-rings 182 and the rear surface of the target wafer W, the support wafer S or the stacked wafer T. In addition, the first transfer arm 170 may horizontally hold the target wafer W, the support wafer S or the stacked wafer T on the O-rings 182.

In addition, guide members 183 and 184 are installed on the arm portion 180 outside of the target wafer W, the support wafer S or the stacked wafer T held by the O-rings 182. The first guide members 183 are installed at a distal end of the tip portion 180a of the arm portion 180. The second guide member 184 is formed in an arc shape along an outer circumference of the target wafer W, the support wafer S or the stacked wafer T and is installed at the side of the support portion 181. The guide members 183 and 184 may prevent the target wafer W, the support wafer S or the stacked wafer T from protruding or slipping and dropping from the first transfer arm 170. In addition, when the target wafer W, the support wafer S or the stacked wafer T is held at an appropriate position on the O-rings 182, the target wafer W, the support wafer S or the stacked wafer T does not make contact with the guide members 183 and 184.

Figure 17:
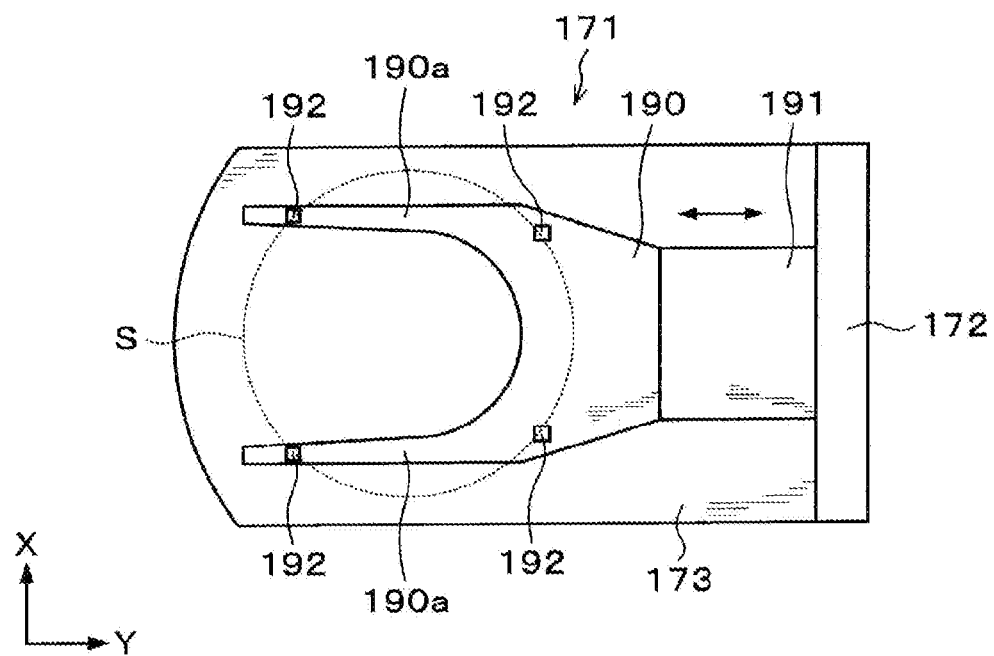
FIG. 17 is a plan view schematically showing a configuration of a second transfer arm.

The second transfer arm 171 holds, for example, the outer peripheral portion of the front surface, i.e., the joint surface $S_J$, of the support wafer S for transfer. That is, the second transfer arm 171 holds the outer peripheral portion of the joint surface $S_J$ of the support wafer S, of which the front and rear surfaces are reversed in the reversing unit 111, and transfers the support wafer S. As shown in FIG. 17, the second transfer arm 171 includes an arm portion 190, of which a distal end branches into two tip portions 190a, and a support portion 191, which is formed integrally with the arm portion 190 and supports the arm portion 190.

Figure 18:
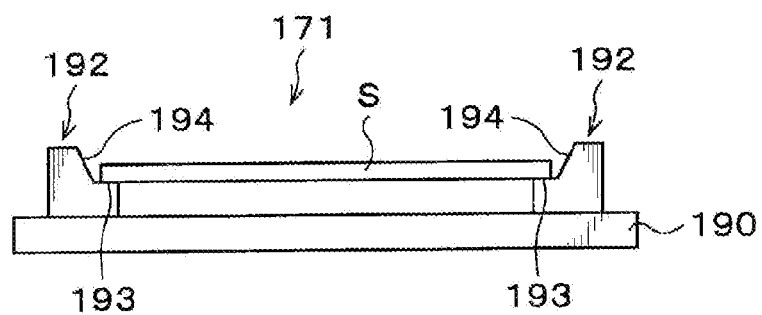
FIG. 18 is a side view schematically showing a configuration of a second transfer arm.

As shown in FIGS. 17 and 18, second holding members 192 are installed at a plurality of, for example, four places on the arm portion 190. The second holding members 192 include mounting portions 193, on which the outer peripheral portion of the joint surface $S_J$ of the support wafer S is mounted, and taper portions 194, which extend upward from the mounting portions 193 and have an inner surface expanding upwardly from the bottom in a taper shape. The mounting portions 193 hold the outer peripheral portion of, for example, 1 mm or less from a rim of the support wafer S. In addition, since the inner surface of the taper portions 194 expands upwardly from the bottom in a taper shape, for example, even though the support wafer S delivered to the second holding members 192 is dislocated from a predetermined position in the horizontal direction, the support wafer S is smoothly guided to the taper portions 194 and then positioned to be held on the mounting portions 193. Also, the second transfer arm 171 may horizontally hold the support wafer S on the second holding members 192.

Figure 19:
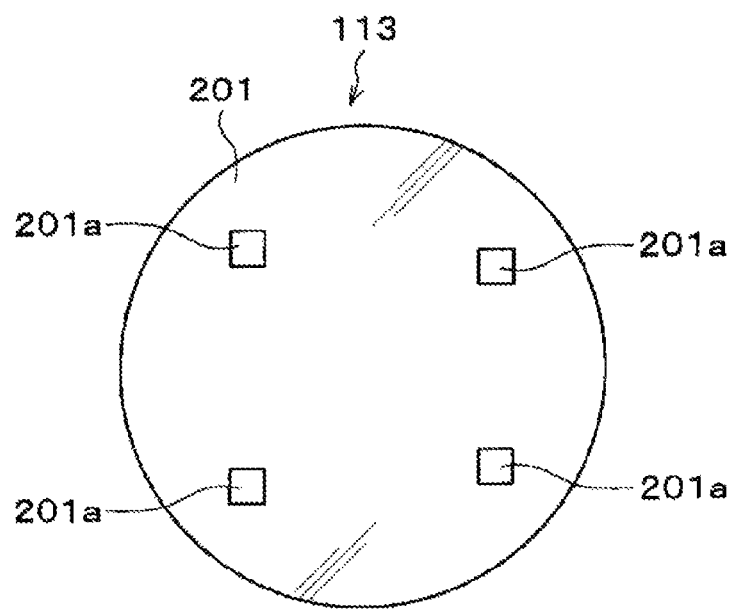
FIG. 19 is an explanatory view showing cutouts formed in a second holding unit.

In addition, as shown in FIG. 19, cutouts 201a are formed at, for example, four places in a second holding unit 201 of the joining unit 113 described later. When the support wafer S is delivered from the second transfer arm 171 to the second holding unit 201, the cutouts 201a may prevent the second holding members 192 of the second transfer arm 171 from interfering with the second holding unit 201.

Figure 20:
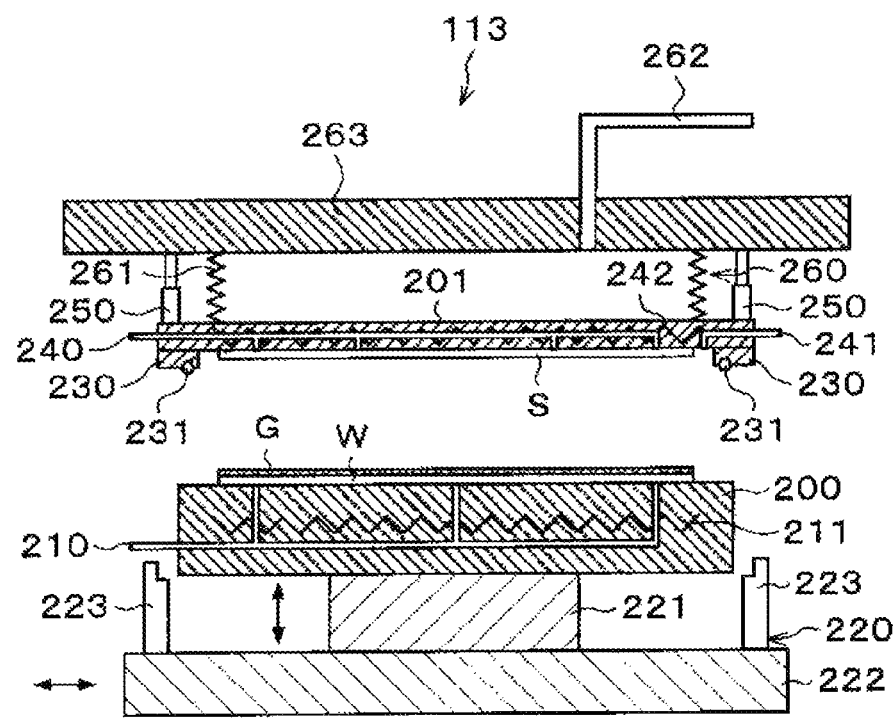
FIG. 20 is a longitudinal sectional view schematically showing a configuration of a joining unit.

Next, a configuration of the above-described joining unit 113 will be described. As shown in FIG. 20, the joining unit 113 includes a first holding unit 200 configured to mount and hold the target wafer W at an upper surface thereof, and the second holding unit 201 configured to attract and hold the support wafer S at a lower surface thereof. The first holding unit 200 is installed below the second holding unit 201 and arranged to face the second holding unit 201. That is, the target wafer W held by the first holding unit 200 and the support wafer S held by the second holding unit 201 are arranged to face each other.

A suction pipe 210, which is configured to attract and hold the target wafer W, is installed inside the first holding unit 200. The suction pipe 210 is connected to a negative pressure generator (not shown), for example, a vacuum pump. In addition, the first holding unit 200 is made of a material having sufficient strength, which is not deformed even if a load is applied by a pressing mechanism 260 to be described later, for example, ceramics such as silicon carbide ceramic or aluminum nitride ceramic.

In addition, a heating mechanism 211 configured to heat the target wafer W is installed inside the first holding unit 200. For example, a heater may be used in the heating mechanism 124.

A moving mechanism 220, which is configured to move the first holding unit 200 and the target wafer W in a vertical direction and a horizontal direction, is installed below the first holding unit 200. The moving mechanism 220 can tridimensionally move the first holding unit 200, for example, with a precision of ±1 μm. The moving mechanism 220 includes a vertical moving part 221 configured to move the first holding unit 200 in a vertical direction, and a horizontal moving part 222 configured to move the first holding unit 200 in a horizontal direction. Each of the vertical moving part 221 and the horizontal moving part 222 has, for example, a ball screw (not shown) and a motor (not shown) configured to rotate the ball screw.

Support members 223 configured to be extendable in a vertical direction is installed on the horizontal moving part 222. The support members 223 are installed at, for example, three places, outside the first holding unit 200. In addition, as shown in FIG. 21, the support members 223 may support a protrusion 230, which is formed to protrude downward from an outer peripheral lower surface of the second holding unit 201.

Figure 21:
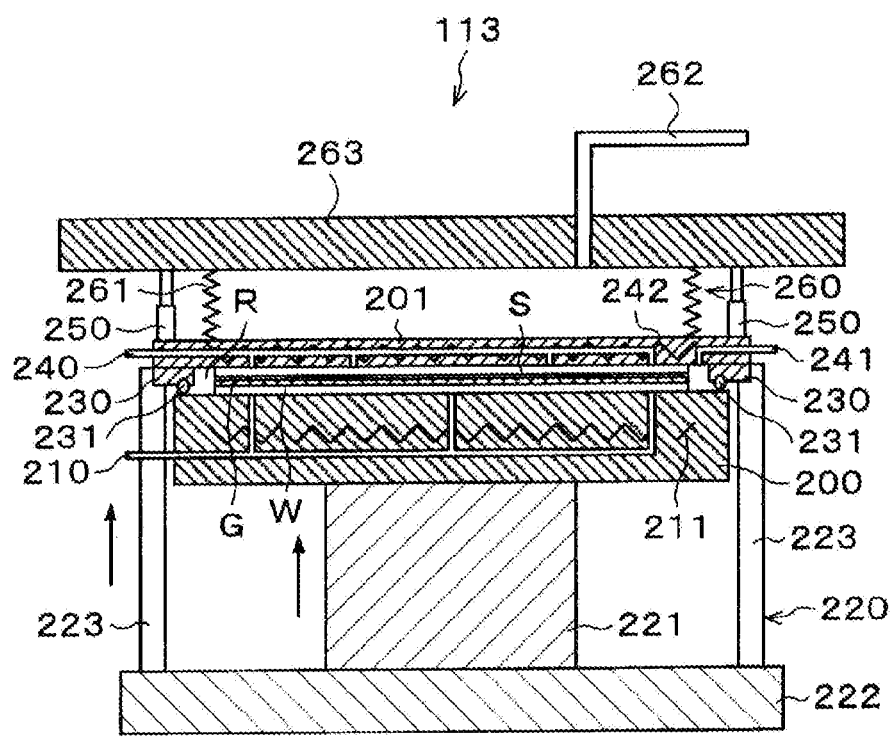
FIG. 21 is a longitudinal sectional view schematically showing a configuration of a joining unit.

In the above-described moving mechanism 220, the position of the target wafer W on the first holding unit 200 can be aligned in a horizontal direction and, as shown in FIG. 21, the first holding unit 200 may be moved upward to define a joining space R for joining the target wafer W and the support wafer S. The joining space R is a space surrounded by the first holding unit 200, the second holding unit 201 and the protrusion 230. In addition, when the joining space R is defined, a vertical distance between the target wafer W and the support wafer S in the joining space R can be adjusted by adjusting a height of the support members 223.

In addition, lift pins (not shown), which support and lift the target wafer W or the stacked wafer T from the bottom, are installed below the first holding unit 200. The lift pins pass through through-holes (not shown) formed in the first holding unit 200 to project from the upper surface of the first holding unit 200.

The second holding unit 201 is made of, for example, aluminum having elasticity. In addition, as described later, the second holding unit 201 is configured such that a portion, for example, the central portion thereof can be bent when a predetermined pressure, for example, 0.7 atmosphere (=0.07 MPa), is applied to the entire surface of the second holding unit 201.

As shown in FIG. 20, the above-described protrusion 230 is formed on the outer peripheral lower surface of the second holding unit 201 to protrude downward from the outer peripheral lower surface. The protrusion 230 is formed along the outer periphery of the second holding unit 201. In addition, the protrusion 230 may be formed integrally with the second holding unit 201.

A seal member 231 configured to maintain the airtightness of the joining space R is installed on the lower surface of the protrusion 230. The seal member 231 has an annular shape and is positioned in a groove formed in the lower surface of the protrusion 230 and includes, for example, an O-ring. In addition, the seal member 231 has elasticity. Also, any component having a sealing function may be used as the seal member 231, and the seal member 231 may be not limited to this embodiment.

A suction pipe 240 configured to attract and hold the support wafer S is installed inside the second holding unit 201. The suction pipe 240 is connected to a negative pressure generator (not shown), for example, a vacuum pump.

In addition, an intake pipe 241, which is configured for intake of an atmosphere of the joining space R, is installed inside the second holding unit 201. One end of the intake pipe 241 is opened at a location in which the support wafer S is not held in the lower surface of the second holding unit 201. Also, the other end of the intake pipe 241 is connected to a negative pressure generator (not shown), for example, a vacuum pump or the like.

Further, a heating mechanism 242 configured to heat the support wafer S is installed inside the second holding unit 201. A heater, for example, may be used as the heating mechanism 242.

Support members 250, which are configured to support the second holding unit 201, and the pressing mechanism 260, which is configured to downwardly press the second holding unit 201 in a vertical direction, are installed on the upper surface of the second holding unit 201. The pressing mechanism 260 includes a pressure vessel 261 installed to cover the target wafer W and the support wafer S, and a fluid supply pipe 262 configured to supply fluid, for example, compressed air, into the pressure vessel 261. In addition, the support members 250 are configured to be extendable in a vertical direction and installed at, for example, three places, outside the pressure vessel 261.

The pressure vessel 261 includes bellows made of, for example, stainless steel, which is extendable in, for example, a vertical direction. The pressure vessel 261 has a lower surface in contact with the upper surface of the second holding unit 201 and an upper surface in contact with a lower surface of a support plate 263 installed above the second holding unit 201. The fluid supply pipe 262 has one end connected to the pressure vessel 261 and the other end connected to a fluid supply source (not shown). In addition, the pressure vessel 261 is supplied with the fluid from the fluid supply pipe 262. Here, since the upper surface of the pressure vessel 261 makes contact with the lower surface of the support plate 263, the pressure vessel 261 may extend only downward, thereby pressing the second holding unit 201 installed on the lower surface of the pressure vessel 261 downward. In such a case, since the inside of the pressure vessel 261 is also pressurized with the fluid, the pressure vessel 261 may press the second holding unit 201 with in-plane uniformity. The load in pressing the second holding unit 201 is adjusted by controlling the pressure of compressed air, which is supplied to the pressure vessel 261. In addition, the support plate 263 can be made of a member having sufficient strength not to be deformed even when it receives reaction force of the load applied to the second holding unit 201 by the pressing mechanism 260. Also, while omitting the support plate 263 of the embodiment, it may be configured such that the upper surface of the pressure vessel 261 may make contact with a ceiling surface of the processing vessel 100.

Also, the joining devices 31 to 33 have the same configuration as the above-described joining device 30, and thus, a description thereof will be omitted.

Figure 22:
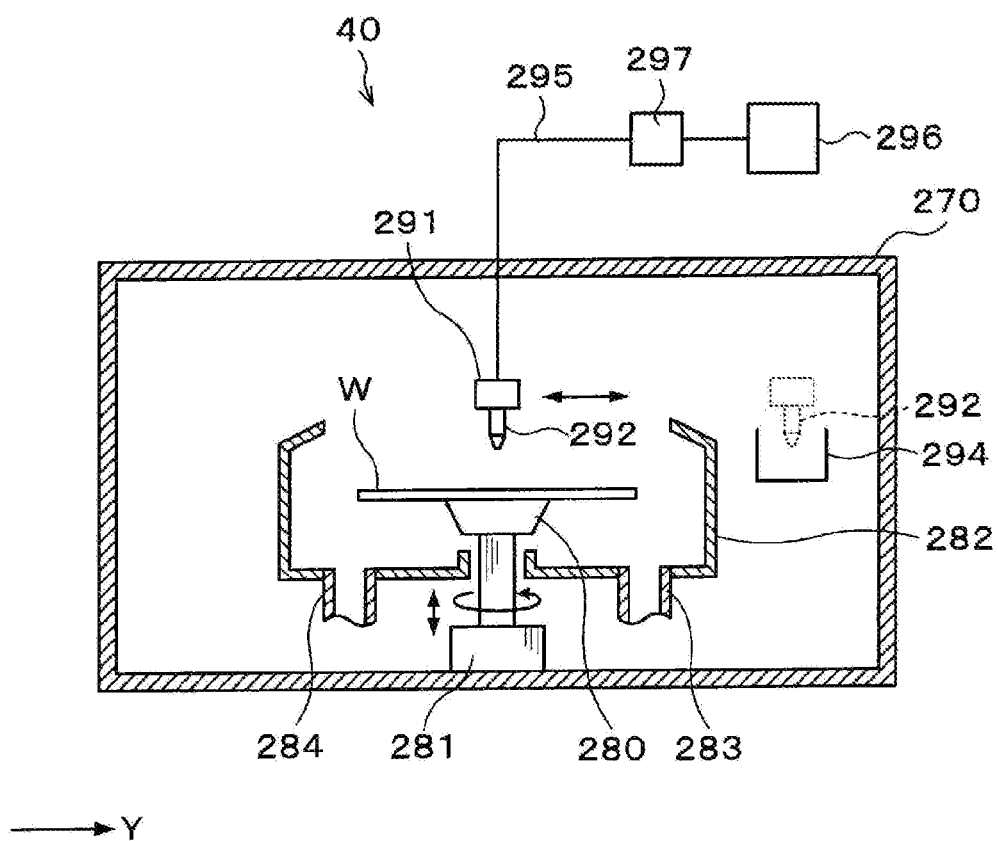
FIG. 22 is a longitudinal sectional view schematically showing a configuration of a coating device.

Subsequently, a configuration of the above-described coating device 40 will be described. As shown in FIG. 22, the coating device 40 includes an internally sealable processing vessel 270. An inlet/outlet (not shown), through which the target wafer W is passed, is formed at a lateral side of the processing vessel 270 facing the wafer transfer region 60, and an opening/closing shutter (not shown) is installed in the inlet/outlet.

A spin chuck 280 is installed in the central portion of the processing vessel 270 as a rotary holding unit configured to hold and rotate the target wafer W. The spin chuck 280 has a horizontal upper surface, and a suction port (not shown) configured to suck, for example, the target wafer W, is installed on the upper surface. The suction through the suction port allows the target wafer W to be attracted and held on the spin chuck 280.

A chuck drive unit 281, which is provided with, for example, a motor, is installed below the spin chuck 280. The spin chuck 280 can be rotated at a predetermined speed by the chuck drive unit 281. Further, the chuck drive unit 281 is equipped with a lifting drive source such as a cylinder, and can lift the spin chuck 190.

A cup 282 is provided around the spin chuck 280 to receive and collect liquid dropped or scattered from the target wafer W. A discharge pipe 283 for draining the collected liquid and an exhaust pipe 284 for exhausting an atmosphere in the cup 282 are connected to the bottom surface of the cup 282.

Figure 23:
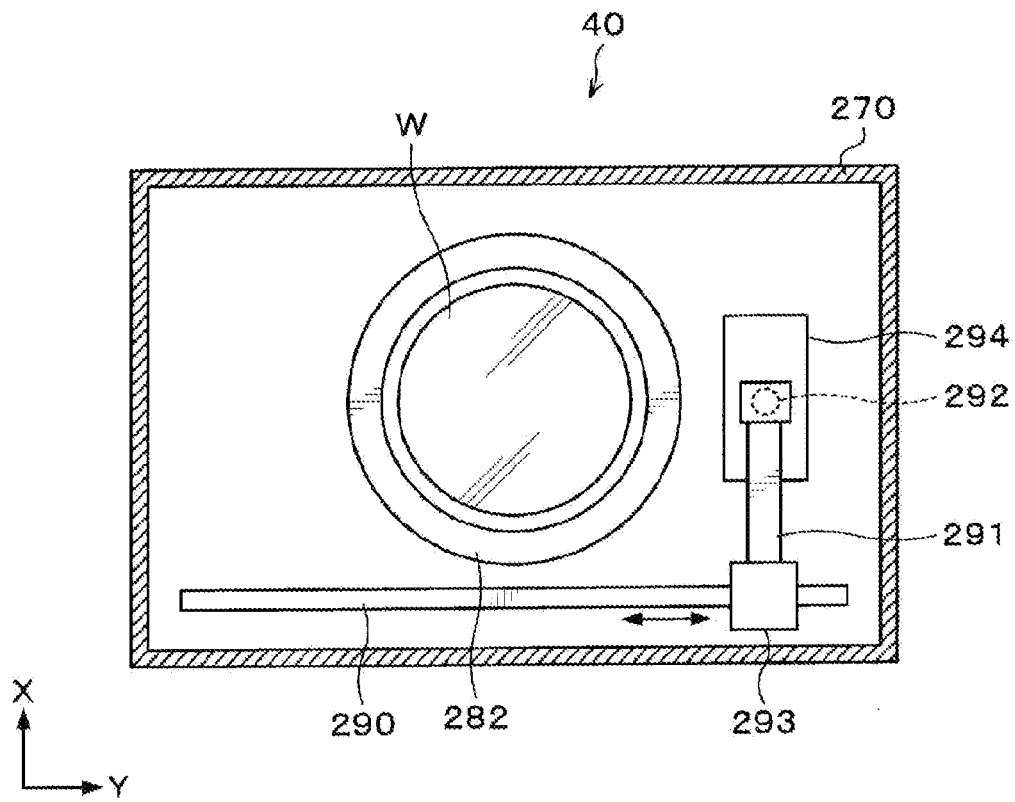
FIG. 23 is a transverse sectional view schematically showing a configuration of a coating device.

As shown in FIG. 23, a rail 290 extending in a Y direction (left and right directions in FIG. 23) is formed at the back of the cup 282 in a negative direction of an X direction (at a lower side in FIG. 23). The rail 290 is formed at, for example, from an outer side of the cup 282 in a negative direction of the Y direction (left side in FIG. 23) to an outer side of the cup 282 in a positive direction of the Y direction (right side in FIG. 23). An arm 291 is mounted on the rail 290.

As shown in FIGS. 22 and 23, an adhesive nozzle 292, which is an adhesive supply unit configured to supply the adhesive G in a liquid state to the target wafer W, is supported by the arm 291. As shown in FIG. 23, the arm 291 is movable on the rail 290 by a nozzle drive unit 293. With this configuration, the adhesive nozzle 292 can move from a standby section 294 installed at an outer side of the cup 282 in a positive direction of the Y direction to an upper side of the central portion of the target wafer W positioned within the cup 282, and also can move in a radial direction of the target wafer W. Also, the arm 291 may be liftable by the nozzle drive unit 293 to adjust the height of the adhesive nozzle 292.

As shown in FIG. 22, a supply pipe 295 configured to supply the adhesive G to the adhesive nozzle 292 is connected to the adhesive nozzle 292. The supply pipe 295 is in communication with an adhesive supply source 296 configured to store the adhesive G therein. In addition, a supply kit 297 including a valve, a flow controller or the like configured to control the flow of the adhesive G is installed at the supply pipe 295.

In addition, a back rinse nozzle (not shown) configured to spray a cleaning liquid toward the rear surface, i.e., the non-joint surface $W_N$, of the target wafer W may be installed below the spin chuck 280. The non-joint surface $W_N$ and the outer peripheral portion of the target wafer W are cleaned with the cleaning liquid sprayed by the back rinse nozzle.

Figure 24:
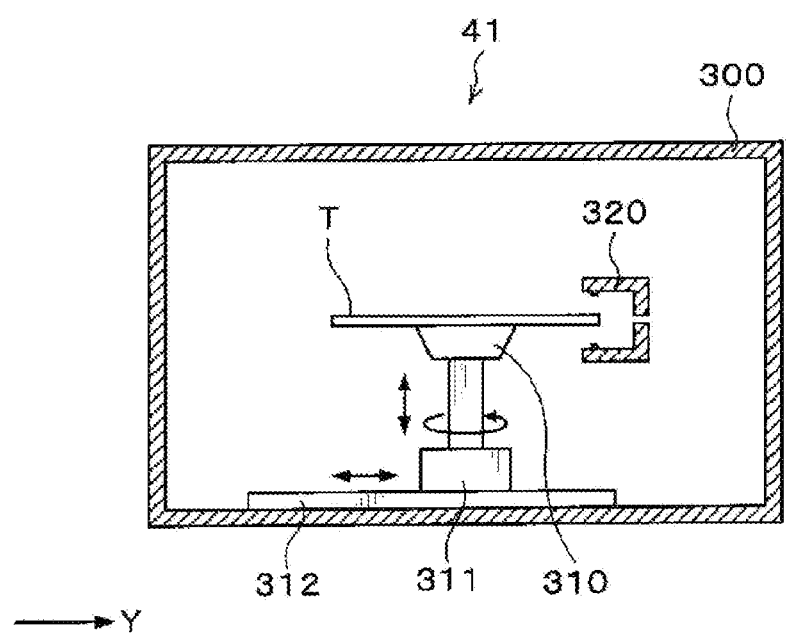
FIG. 24 is a longitudinal sectional view schematically showing a configuration of an adhesive removal device.
Figure 25:
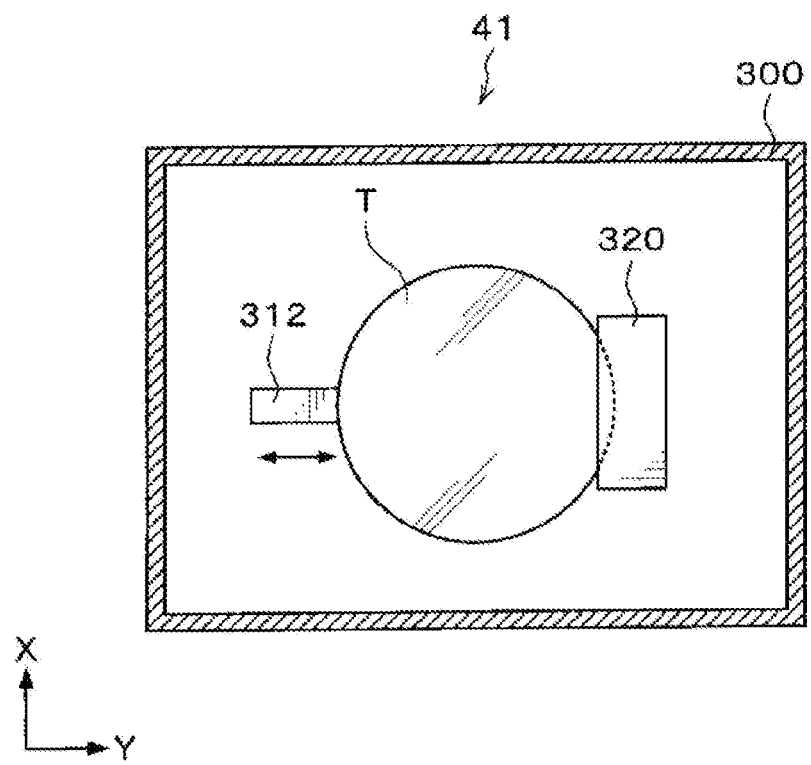
FIG. 25 is a transverse sectional view schematically showing a configuration of the adhesive removal device.

Next, a configuration of the above-described adhesive removal device 41 will be described. As shown in FIGS. 24 and 25, the adhesive removal device 41 has an internally sealable processing vessel 300. An inlet/outlet (not shown), through which the stacked wafer T is passed, is formed in a lateral side of the processing vessel 300 facing the wafer transfer region 60, and an opening/closing shutter (not shown) is installed in the inlet/outlet.

A spin chuck 310, as a rotary holding unit, configured to hold and rotate the stacked wafer T is installed in the central portion of the processing vessel 300. The spin chuck 310 has a horizontal upper surface, on which, for example, a suction port (not shown) configured to suck the stacked wafer T is installed. The suction through the suction port allows the stacked wafer T to be attracted and hold on the spin chuck 310.

A chuck drive unit 311, which is provided with, for example, a motor, is installed below the spin chuck 310. The spin chuck 310 can be rotated at a predetermined speed by the chuck drive unit 311. Further, the chuck drive unit 311 is equipped with a lift drive source such as a cylinder, and can move the spin chuck 310 up and down. Also, the chuck drive unit 311 is installed on a rail 312 extending along a Y direction (left and right directions in FIG. 24). The spin chuck 310 is configured to be movable along the rail 312 by the chuck drive unit 311.

A solvent supply unit 320 configured to supply the solvent of the adhesive G to an outside adhesive $G_E$, which protrudes from the outer lateral side of the stacked wafer T in the joining device 30, which will be described later, is installed at a lateral side of the spin chuck 310. The solvent of the adhesive G supplied from the solvent supply unit 320 allows the surface of the outside adhesive $G_E$ to be removed. The solvent supply unit 320 is fixed to the processing vessel 300 by a support member (not shown). In addition, although the adhesive G protruding out from the outer lateral side of the stacked wafer T is separately called the outside adhesive $G_E$ for convenience of description, the adhesive G and the outside adhesive $G_E$ are the same.

Figure 26:
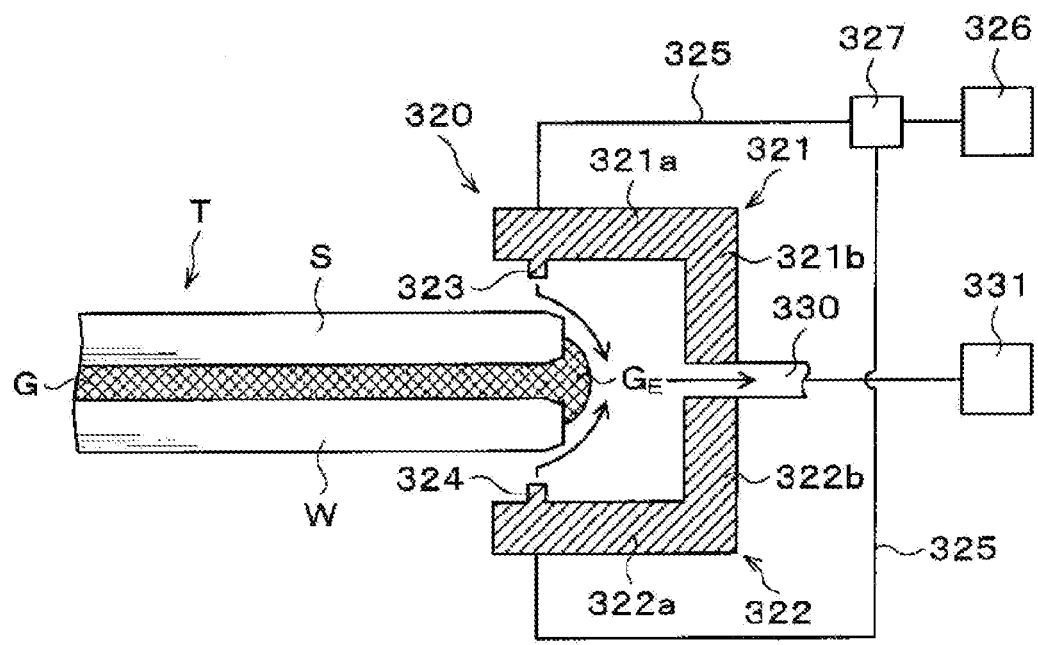
FIG. 26 is a longitudinal sectional view schematically showing a configuration of a solvent supply unit.

As shown in FIG. 26, the solvent supply unit 320 has an upper nozzle 321 disposed above the stacked wafer T, and a lower nozzle 322 disposed below the stacked wafer T. The upper nozzle 321 is provided with a ceiling portion 321a and a sidewall portion 321b and installed to cover an upper side of the outer peripheral portion of the stacked wafer T. Also, the lower nozzle 322 is provided with a bottom portion 322a and a sidewall portion 322b and installed to cover a lower side of the outer peripheral portion of the stacked wafer T. In addition, by both the upper nozzle 321 and the lower nozzle 322, as shown in FIGS. 24 and 25, the solvent supply unit 320 has a substantially rectangular parallelepiped shape. Also, a lateral side of the solvent supply unit 320 facing the spin chuck 310 is formed with an opening, into which the outer peripheral portion of the stacked wafer T held by the spin chuck 310 is inserted. Further, in the embodiment, the upper nozzle 321 and the lower nozzle 322 function as the solvent supply unit of the present disclosure.

As shown in FIG. 26, a supply port 323, through which the solvent of the adhesive G is supplied to the outside adhesive $G_E$ from the upper side of the stacked wafer T, is formed on a lower surface of the ceiling portion 321a of the upper nozzle 321. Also, a supply port 324, through which the solvent of the adhesive G is supplied to the outside adhesive $G_E$ from the lower side of the stacked wafer T, is formed on an upper surface of the bottom portion 322a of the lower nozzle 322.

A supply pipe 325, through which the solvent of the adhesive G is supplied to the upper nozzle 321 and the lower nozzle 322, is connected to the upper nozzle 321 and the lower nozzle 322. The supply pipe 325 is in communication with a solvent supply source 326 configured to reserve the solvent of the adhesive G therein. In addition, a supply kit 327 including a valve, a flow rate adjuster or the like configured to control the flow of the solvent of the adhesive G is installed at the supply pipe 326. Also, for example, an organic thinner is used as the solvent of the adhesive G, and trimethylbenzen (mesitylene) is used in the embodiment.

A discharge pipe 330, through which the solvent of the adhesive G after the surface of the outside adhesive $G_E$ is removed is drained and an atmosphere of a region surrounded by the upper nozzle 321 and the lower nozzle 322 is exhausted, is installed between a sidewall portion 321b of the upper nozzle 321 and a sidewall portion 322b of the lower nozzle. The discharge pipe 330 is connected to an ejector 331 as a drain mechanism.

The solvent supply unit 320 is configured as described above, and the solvent of the adhesive G, which is supplied from the supply port 323 of the upper nozzle 321 and the supply port 324 of the lower nozzle 322 to the stacked wafer T, flows over the outside adhesive $G_E$ and is drained through the discharge pipe 330. The surface of the outside adhesive $G_E$ is removed by the solvent of the adhesive G, and the outside adhesive $G_E$ is formed to have a predetermined size. In addition, the predetermined size of the outside adhesive $G_E$ will be described in detail later.

Also, in the adhesive removal device 41, a cup (not shown) configured to collect liquid scattered or falling from the stacked wafer T is installed around the spin chuck 310 and outside the solvent supply unit 320. The cup has the same configuration as the cup 282 in the coating device 40. In addition, although in the adhesive removal device 41 of the embodiment, the spin chuck 310 is moved along the rail 312, the solvent supply unit 320 may be moved in the horizontal direction (the Y direction in FIGS. 24 and 25).

Figure 27:
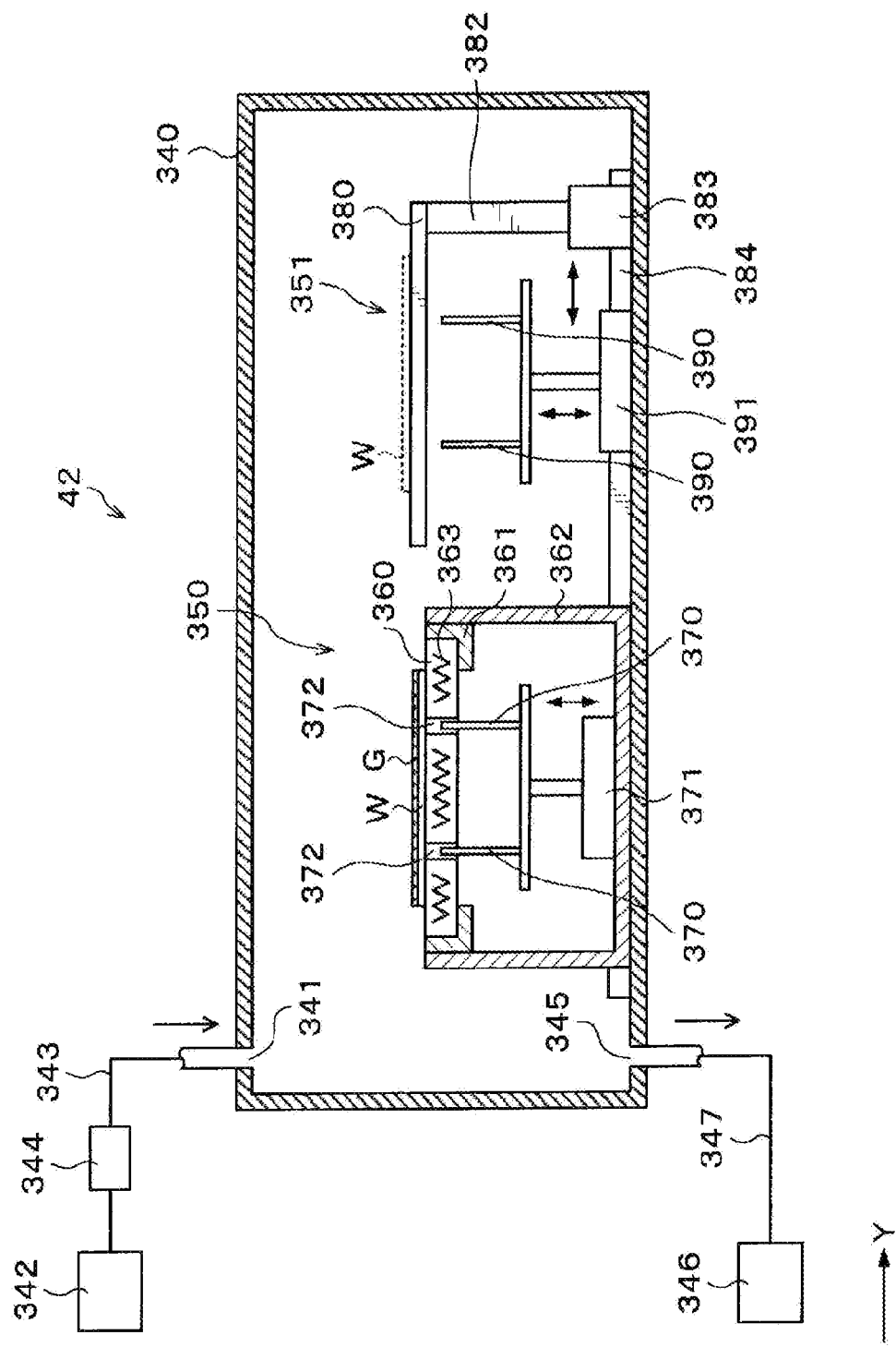
FIG. 27 is a longitudinal sectional view schematically showing a configuration of a heat processing device.

Next, a configuration of the above-described heat processing devices 42 to 47 will be described. As shown in FIG. 27, the heat processing device 42 has an internally sealable processing vessel 340. An inlet/outlet (not shown), through which the target wafer W is passed, is formed in a lateral side of the processing vessel 340 facing the wafer transfer region 60, and an opening/closing shutter (not shown) is installed at the inlet/outlet.

A gas supply port 341 configured to supply the inside of the processing vessel 340 with, for example, an inert gas such as nitrogen gas is formed in the ceiling surface of the processing vessel 340. A gas supply pipe 343 in communication with a gas supply source 342 is connected to the gas supply port 341. A supply kit 344 including a valve, a flow controller or the like configured to control the flow of the inert gas is installed at the gas supply pipe 343.

An intake port 345 configured for intake of an atmosphere inside the processing vessel 340 is formed in a bottom surface of the processing vessel 340. An intake pipe 347 in communication with a negative pressure generator 346 such as a vacuum pump is connected to the intake port 345.

A heating unit 350 configured to heat the target wafer W and a temperature adjustment unit 351 configured to adjust a temperature of the target wafer W are installed inside the processing vessel 340. The heating unit 350 and the temperature adjustment unit 351 are arranged and disposed in a Y direction.

The heating unit 350 is provided with an annular holding member 361 configured to receive a hot plate 360 and hold the outer peripheral portion of the hot plate 360, and a support ring 362 having a substantially cylindrical shape surrounding the outer periphery of the holding member 361. The hot plate 360 is in the shape of a substantially circular disk having a thickness, and may allow the target wafer W to be mounted and heated thereon. In addition, a heater 363, for example, is embedded in the hot plate 360. The heating temperature of the hot plate 360 is controlled by, for example, a control unit 400, and the target wafer W mounted on the hot plate 360 is heated at a predetermined temperature.

For example, three lift pins 370, which support and lift the target wafer W from the bottom, are installed below the hot plate 360. The lift pins 370 may be moved up and down by a lift drive unit 371. Through-holes 372, which pass through the hot plate 360 in a thicknesswise direction, are formed at, for example, three places, in the vicinity of the center of the hot plate 360. In addition, the lift pins 370 pass through the through-holes 372 and may protrude from the upper surface of the hot plate 360.

Figure 28:
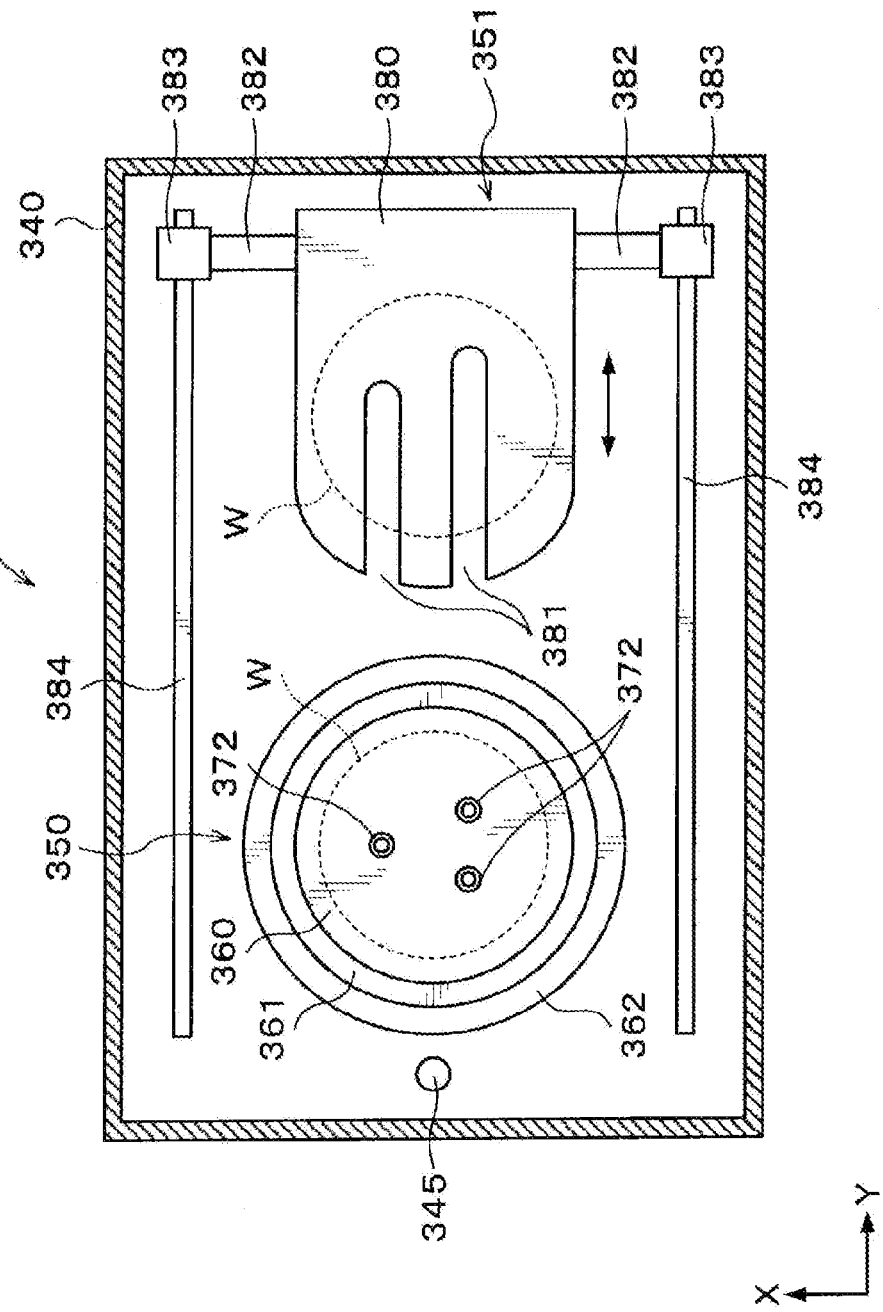
FIG. 28 is a transverse sectional view schematically showing the configuration of a heat processing device.

The temperature adjustment unit 351 has a temperature adjustment plate 380. The temperature adjustment plate 380 has a shape of a substantially quadrangular plate and its end face toward a side of the hot plate 360 is curved in a shape of a circular arc, as shown in FIG. 28. The temperature adjustment plate 380 has two slits 381 formed along a Y direction. The slits 381 are formed from the end face of the temperature adjustment plate 380 facing the hot plate 360 to the vicinity of the center of the temperature adjustment plate 380. The slits 381 may prevent the temperature adjustment plate 380 from interfering with the lift pins 370 of the heating unit 350 and later-described lift pins 390 of the temperature adjustment unit 351. In addition, a temperature adjustment member (not shown) such as a Peltier element is embedded in the temperature adjustment plate 380. The cooling temperature of the temperature adjustment plate 380 is controlled, for example, by the control unit 400, and the target wafer W mounted on the temperature adjustment plate 380 is cooled to a predetermined temperature.

As shown in FIG. 27, the temperature adjustment plate 380 is supported by a support arm 382. The support arm 382 is provided with a drive unit 383. The drive unit 383 is installed on a rail 384 extending in a Y direction. The rail 384 extends from the temperature adjustment unit 351 to the heating unit 350. The drive unit 383 allows the temperature adjustment plate 380 to be movable along the rail 384 between the heating unit 350 and the temperature adjustment unit 351.

The lift pins 390, for example, three lift pins, which support and lift the target wafer W from the bottom, are installed below the temperature adjustment plate 380. The lift pins 390 can be moved up and down by a lift drive unit 391. In addition, the lift pins 390 pass through the slits 381 and may protrude from the upper surface of the temperature adjustment plate 380.

Also, the heat processing devices 42 to 47 have the same configuration as the above-described heat processing device 42, and thus, descriptions thereof will be omitted.

The temperature of the stacked wafer T can also be adjusted in the heat processing devices 42 to 47. Further, in order to adjust the temperature of the stacked wafer T, a temperature adjustment device (not shown) may be installed. The temperature adjustment device has the same configuration as the above-described heat processing device 42, and a temperature adjustment plate is used instead of the hot plate 360. Since the temperature adjustment plate has a cooling member such as a Peltier element installed therein, the temperature adjustment plate can be adjusted to a setting temperature.

As shown in FIG. 1, the above-described joining system 1 has a control unit 400 installed therein. The control unit 400 is, for example, a computer, and includes a program storage unit (not shown). The program storage unit stores a program which controls processing of the target wafer W, the support wafer S and the stacked wafer T in the joining system 1. The program storage unit also stores a program which controls operation of a driving system including the above-described processing devices and the transfer unit to implement a joining process in the joining system 1, which will be described later. The programs may also be installed in the control unit 400 from a computer readable storage medium H such as a hard disk (HD), a flexible disk (FD), a compact disk (CD), a magneto-optical disk (MO), a memory card or the like.

Figure 29:
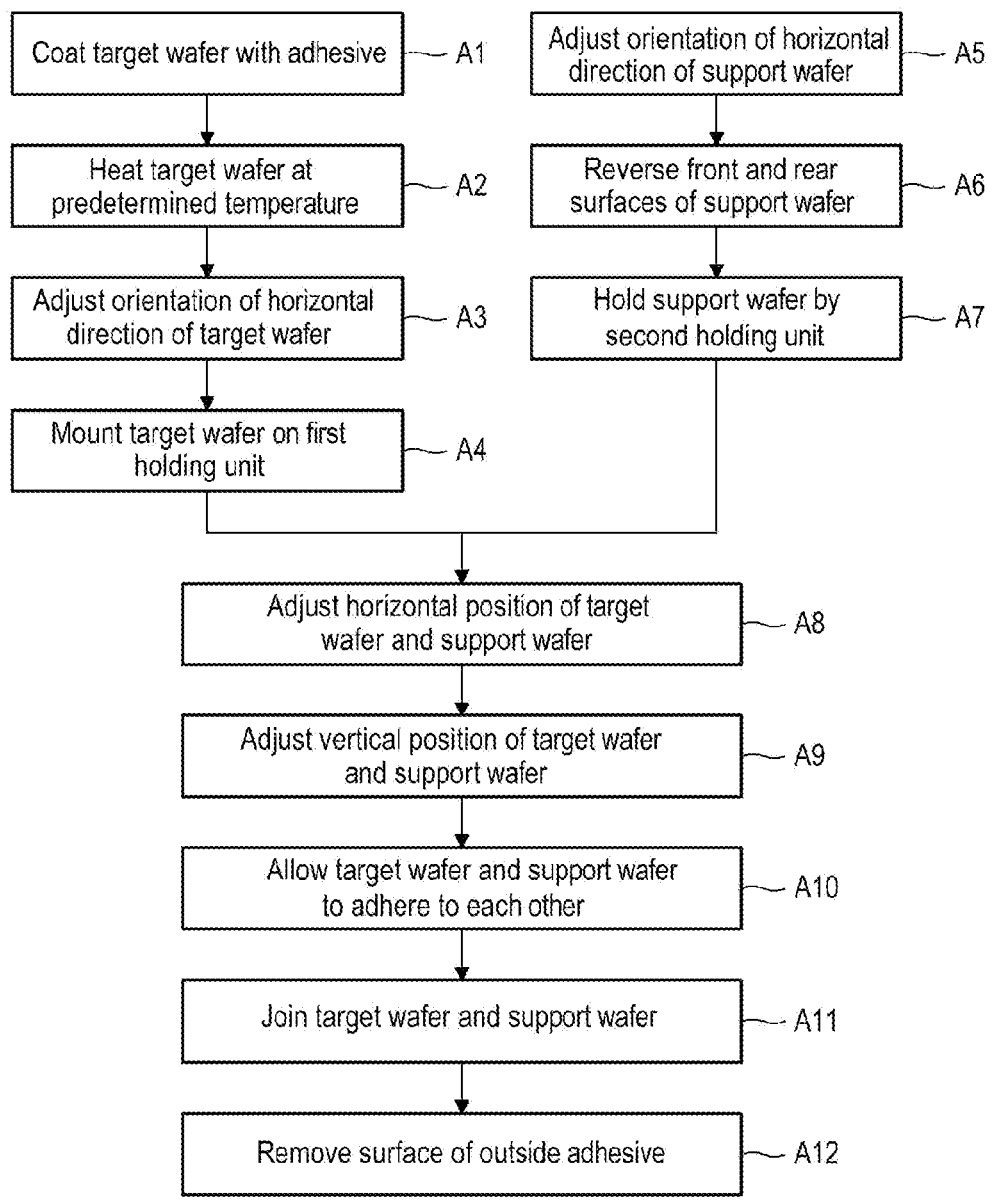
FIG. 29 is a flowchart showing main operations of joining processing.

Next, a joining processing method of the target wafer W and the support wafer S, to be performed using the joining system 1 configured as above, will be described. FIG. 29 is a flowchart showing main operations of the joining processing.

First, the cassette $C_W$ having a plurality of the target wafers W accommodated therein, the cassette $C_S$ having a plurality of the support wafers S accommodated therein and the cassette $C_T$ being empty are respectively mounted on predetermined cassette mounting plates 11 of the carry-in/carry-out station 2. Then, the target wafer W in the cassette $C_W$ is taken out by the wafer transfer device 22 and transferred to the transition device 50 of the third processing block G3 of the processing station 3. Here, the target wafer W is transferred while its non-joint surface $W_N$ faces downward.

Next, the target wafer W is transferred to the coating device 40 by the wafer transfer device 61. The target wafer W carried in the coating device 40 is delivered from the wafer transfer device 61 to the spin chuck 280 and then attracted and held thereby. Here, the non-joint surface $W_N$ of the target wafer W is attracted and held.

Subsequently, the adhesive nozzle 292 positioned within the standby section 294 is moved, by the arm 291, above the central portion of the target wafer W. Thereafter, the adhesive G is supplied from the adhesive nozzle 292 onto the joint surface $W_J$ of the target wafer W while rotating the target wafer W by the spin chuck 280. The supplied adhesive G is spread to the entire surface of the joint surface $W_J$ of the target wafer W due to a centrifugal force, and the joint surface $W_J$ of the target wafer W is coated with the adhesive G (Operation A1 in FIG. 29).

Next, the target wafer W is transferred to the heat processing device 42 by the wafer transfer device 61. Here, an inert gas atmosphere is maintained within the heat processing device 42. When the target wafer W is carried in the heat processing device 42, the stacked wafer T is delivered from the wafer transfer device 61 to the lift pins 390, which have been lifted up in advance and are on standby. Subsequently, the lift pins 390 are moved down to mount the target wafer W on the temperature adjustment plate 380.

Thereafter, the drive unit 383 moves the temperature adjustment plate 380 to an upper side of the hot plate 360 along the rail 384, and the target wafer W is delivered to the lift pins 390, which have been lifted up in advance and are on standby. Then, the lift pins 370 are moved down, and the target wafer W is mounted on the hot plate 360. The target wafer W on the hot plate 360 is then heated to a predetermined temperature, for example, 100 to 300 degrees C. (Operation A3 in FIG. 29). As the heating is performed by the hot plate 360, the adhesive G on the target wafer W is heated and then cured.

Thereafter, the lift pins 370 are lifted up, and the temperature adjustment plate 380 is moved to the upper side of the hot plate 360. Subsequently, the target wafer W is delivered from the lift pins 370 to the temperature adjustment plate 380, and the temperature adjustment plate 380 is moved toward the wafer transfer region 60. During the movement of the temperature adjustment plate 380, the temperature of the target wafer W is adjusted to a predetermined temperature.

The target wafer W, which is heat-processed in the heat processing device 42, is transferred to the joining device 30 by the wafer transfer device 61. The target wafer W transferred to the joining device 30 is delivered from the wafer transfer device 61 to the delivery arm 120 of the delivery units 110, and then, delivered from the delivery arm 120 to the wafer support pins 121. Thereafter, the target wafer W is transferred from the wafer support pins 121 to the reversing unit 111 by the first transfer arm 170 of the transfer unit 112.

The target wafer W transferred to the reversing unit 111 is held by the holding members 151 and moved to the position adjustment mechanism 160. Then, a position of the notch portion of the target wafer W is adjusted in the position adjustment mechanism 160, so that an orientation of the horizontal direction of the target wafer W is adjusted (Operation A3 in FIG. 29).

Thereafter, the target wafer W is transferred from the reversing unit 111 to the joining unit 113 by the first transfer arm 170 of the transfer unit 112. The target wafer W transferred to the joining unit 113 is mounted on the first holding unit 200 (Operation A4 in FIG. 29). The target wafer W, of which the joint surface $W_J$ faces upward, i.e., the adhesive G faces upward, is mounted on the first holding unit 200.

While the above-described Operations A1 to A4 are performed on the target wafer W, the support wafer S is processed in succession to the target wafer W. The support wafer S is transferred to the joining device 30 by the wafer transfer device 61. In addition, the process of transferring the support wafer S to the joining device 30 is performed in the same way as the above embodiment, and thus, a description thereof will be omitted.

The support wafer S transferred to the joining device 30 is delivered from the wafer transfer device 61 to the delivery arm 120 of the delivery units 110, and then, also delivered from the delivery arm 120 to the wafer support pins 121. Thereafter, the support wafer S is transferred from the wafer support pins 121 to the reversing unit 111 by the first transfer arm 170 of the transfer unit 112.

The support wafer S transferred to the reversing unit 111 is held by the holding members 151 and is moved to the position adjustment mechanism 160. Then, a position of the notch portion of the support wafer S is adjusted in the position adjustment mechanism 160, so that an orientation of the horizontal direction of the support wafer S is adjusted (Operation A5 in FIG. 29). The support wafer S with an orientation in the horizontal direction is moved from the position adjustment mechanism 160 in the horizontal direction and also moved upward in the vertical direction, and then, the front and rear surfaces of the support wafer S are reversed (Operation A6 in FIG. 29). That is, the joint surface $S_J$ of the support wafer S faces downward.

Thereafter, the support wafer S is moved downward in the vertical direction and then transferred from the reversing unit 111 to the joining unit 113 by the second transfer arm 171 of the transfer unit 112. Here, since the second transfer arm 171 holds only the outer peripheral portion of the joint surface $S_J$ of the support wafer S, the joint surface $S_J$ is not contaminated by, for example, particles and the like attached to the second transfer arm 171. The support wafer S transferred to the joining unit 113 is attracted and held by the second holding unit 201 (Operation A7 in FIG. 29). The second holding unit 201 holds the support wafer S while the joint surface $S_J$ of support wafer S faces downward.

In the joining device 30, if the target wafer W and the support wafer S are respectively held by the first holding unit 200 and the second holding unit 201, the horizontal position of the first holding unit 200 is adjusted by the moving mechanism 220 such that the target wafer W faces the support wafer S (Operation A8 in FIG. 29). At this time, the pressure between the second holding unit 201 and the support wafer S is, for example, 0.1 atmosphere (=0.01 MPa). In addition, the pressure applied to the upper surface of the second holding unit 201 is 1.0 atmosphere (=0.1 MPa) which is atmospheric pressure. In order to maintain the atmospheric pressure applied to the upper surface of the second holding unit 201, the pressure in the pressure vessel 261 of the pressing mechanism 260 may be made to be an atmospheric pressure, or a gap may be formed between the upper surface of the second holding unit 201 and the pressure vessel 261.

Figure 30:
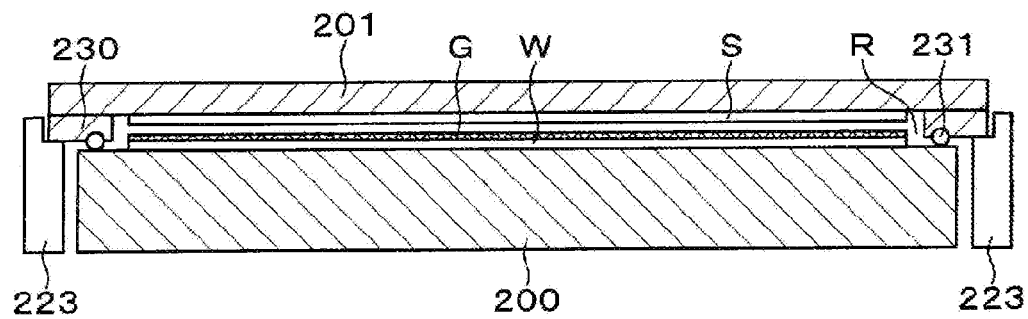
FIG. 30 is an explanatory view illustrating a state where a first holding unit is lifted up.

Next, as shown in FIG. 30, as the moving mechanism 220 allows the first holding unit 200 to be lifted and the support members 223 to extend, the second holding unit 201 is supported by the support members 223. At this time, by adjusting the height of the support members 223, the vertical distance between the target wafer W and the support wafer S is adjusted to be a predetermined distance (Operation A9 in FIG. 29). In addition, this predetermined distance is a height where a central portion of the support wafer S makes contact with the target wafer W when the seal member 231 makes contact with the first holding unit 200 and central portions of the second holding unit 201 and support wafer S are also bent as described later. By doing so, the sealed joining space R is defined between the first holding unit 200 and the second holding unit 201.

Figure 31:
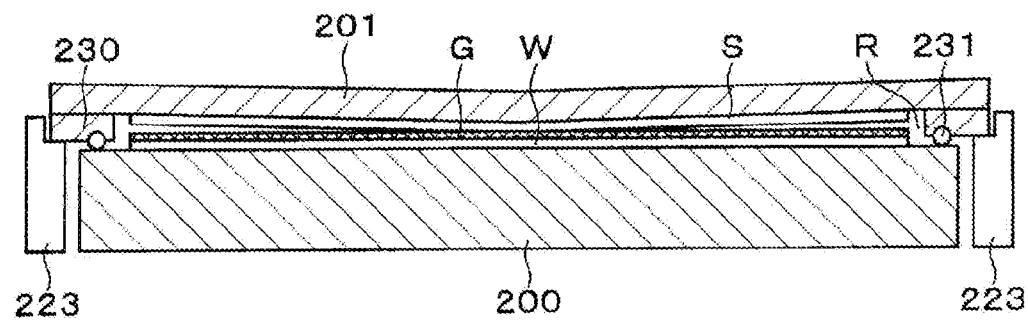
FIG. 31 is an explanatory view illustrating a state where a central portion of a second holding unit is bent.

Thereafter, an atmosphere of the joining space R is inhaled through the intake pipe 241. In addition, if the pressure in the joining space R is reduced to, for example, 0.3 atmosphere (=0.03 MPa), a pressure difference between the pressure applied to the upper surface of the second holding unit 201 and the pressure in the joining space R, i.e., 0.7 atmosphere (=0.07 MPa), is applied to the second holding unit 201. Accordingly, as shown in FIG. 31, the central portion of the second holding unit 201 is bent, and the central portion of the support wafer S held by the second holding unit 201 is also bent. In this way, even though the pressure in the joining space R is reduced to 0.3 atmosphere (=0.03 MPa), since the pressure between the second holding unit 201 and the support wafer S is 0.1 atmosphere (=0.01 MPa), the support wafer S is maintained with being held by the second holding unit 201.

Figure 32:
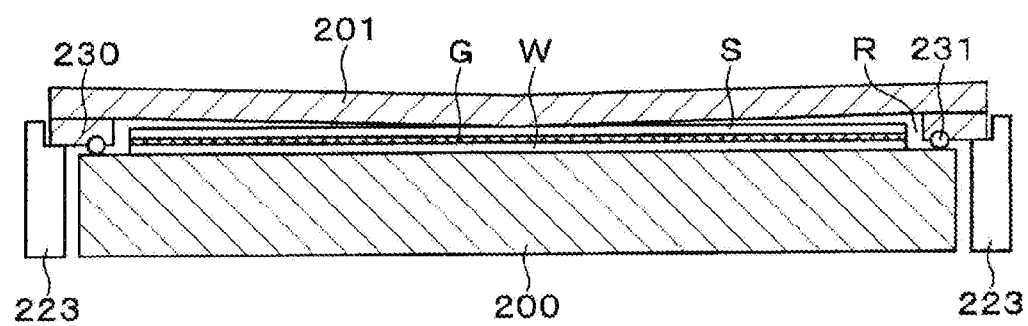
FIG. 32 is an explanatory view illustrating a state where an entire joint surface of the support wafer makes contact with an entire joint surface of a target wafer.

Thereafter, the atmosphere of the joining space R is also inhaled, thereby reducing the pressure in the joining space R. Then, if the pressure in the joining space R is not more than 0.1 atmosphere (=0.01 MPa), the second holding unit 201 cannot hold the support wafer S, so that the support wafer S falls downward, as shown in FIG. 32. Thus, the entire joint surface $S_J$ of the support wafer S comes into contact with the entire joint surface $W_J$ of the target wafer W. Here, the support wafer S comes into contact with the target wafer W gradually from its central portion, which has been in contact with the target wafer W, toward an outer portion in a radial direction. That is, for example, even when air that may become a void is present in the joining space R, since the air is always present further outside than the location where the support wafer S is in contact with the target wafer W, the air is able to escape from a gap between the target wafer W and the support wafer S. In this way, while voids are prevented from being generated, the target wafer W and the support wafer S adhere to each other through the adhesive G (Operation A10 in FIG. 29).

Figure 33:
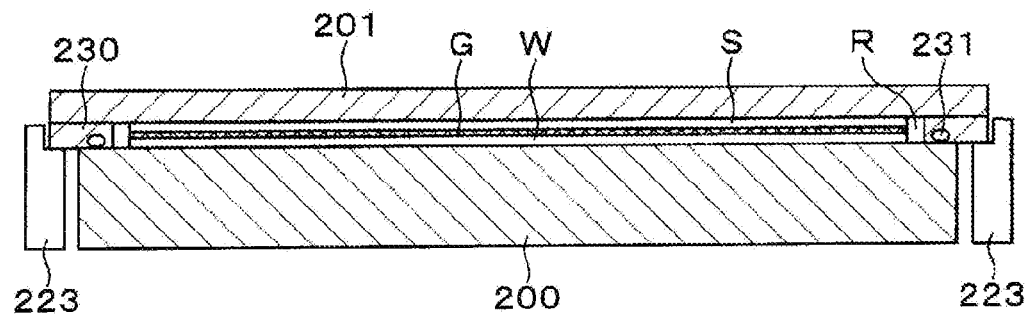
FIG. 33 is an explanatory view illustrating a state where a target wafer and the support wafer are joined.

Thereafter, as shown in FIG. 33, the height of the support members 223 is adjusted, and the lower surface of the second holding unit 201 is brought into contact with the non-joint surface $S_N$ of support wafer S. Here, the seal member 231 is elastically deformed, thereby bringing the first holding unit 200 and the second holding unit 201 into contact with each other. Then, while the heating mechanisms 211 and 242 heat the target wafer W and the support wafer S to a predetermined temperature, for example, 200 degrees C., the pressing mechanism 260 presses the second holding unit 201 downward at a predetermined pressure, for example, 0.5 MPa. Accordingly, the target wafer W and the support wafer S more securely adhere to each other, thereby being joined (Operation A11 in FIG. 29).

Figure 34:
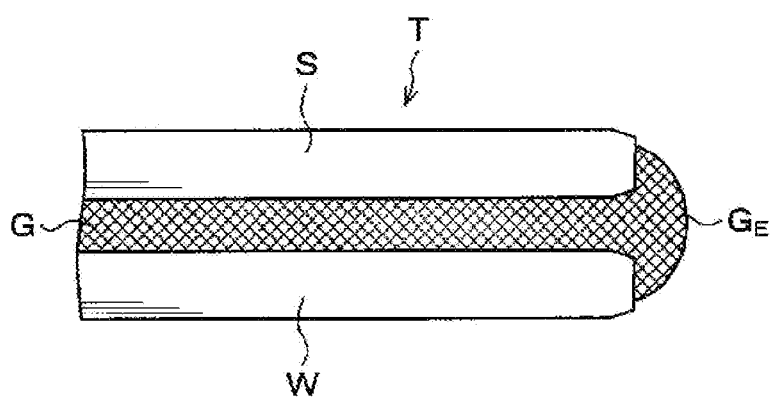
FIG. 34 is an explanatory view illustrating a state where an outside adhesive protrudes from an outer lateral side of a stacked wafer.

In Operation A11, if the target wafer W and the support wafer S are pressed while being heated, as shown in FIG. 34, the adhesive G protrudes out from between the target wafer W and the support wafer S. Then, an outside adhesive $G_E$ protruding from the outer lateral side of the stacked wafer T is formed.

Thereafter, the stacked wafer T having the target wafer W and the support wafer S joined is transferred from the joining unit 113 to the delivery units 110 by the first transfer arm 170 of the transfer unit 112. The stacked wafer T transferred to the delivery units 110 is delivered to the delivery arm 120 through the wafer support pins 121 and also delivered from the delivery arm 120 to the wafer transfer device 61.

Next, the stacked wafer T is transferred to the heat processing device 43 by the wafer transfer device 61. Then, in the heat processing device 43, the temperature of the stacked wafer T is adjusted to a predetermined temperature, for example, normal temperature (23 degrees C.).

Thereafter, the stacked wafer T is transferred to the adhesive removal device 41 by the wafer transfer device 61. The stacked wafer T carried in the adhesive removal device 41 is delivered from the wafer transfer device 61 to the spin chuck 310, thereby being attracted and held. In such a case, the non-joint surface $W_N$ of the target wafer W is attracted and held. In addition, the spin chuck 310 is evacuated to a position in which the stacked wafer T does not collide with the solvent supply unit 320. Subsequently, after the spin chuck 310 is moved down to a predetermined position, the spin chuck 310 is also moved toward the solvent supply unit 320 in a horizontal direction, thereby inserting the outer peripheral portion of the stacked wafer T between the upper nozzle 321 and the lower nozzle 322 in the solvent supply unit 320. Here, the stacked wafer T is positioned in the middle between the upper nozzle 321 and the lower nozzle 322.

Figure 35:
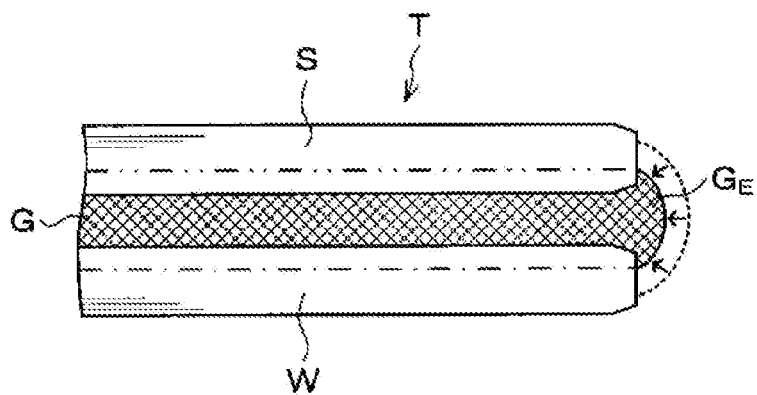
FIG. 35 is an explanatory view illustrating a state where a surface of an outside adhesive protruding out from the outer lateral side of the stacked wafer is removed.

Thereafter, while the stacked wafer T is rotated by the spin chuck 310, the solvent of the adhesive G is supplied to the outer peripheral portion of the stacked wafer T from the upper nozzle 321 and the lower nozzle 322. The supplied solvent of the adhesive G flows over the outside adhesive $G_E$ by injection pressure from the nozzles 321 and 322 and the centrifugal force generated by the rotation of the stacked wafer T, as shown in FIG. 35. Then, the surface of the outside adhesive $G_E$ is removed by the solvent of the adhesive G, and the outside adhesive $G_E$ is formed to have a predetermined size (Operation A12 in FIG. 29). In addition, the solvent of the adhesive G after the surface of the outside adhesive $G_E$ is removed or the atmosphere in the solvent supply unit 320 is forcibly discharged from the discharge pipe 330 by the ejector 331.

Here, after the joining process is completed in the joining system 1, the target wafer W is thinned. When the target wafer W is thinned, if the outside adhesive $G_E$ protrudes excessively more than a position of an end of the target wafer W after being thinned (shown by an alternated long and short dash line in FIG. 35), the outside adhesive $G_E$ is stuck to a device for thinning the target wafer W. If so, the target wafer W cannot be appropriately thinned. If the outside adhesive $G_E$ protrudes excessively less than the position of the end of the target wafer W after being thinned, the outer peripheral portion of the target wafer W may be damaged. That is, it is necessary to protect the outer peripheral portion of the target wafer W by the outside adhesive $G_E$. Therefore, in the above-described Operation A12, the outside adhesive $G_E$ protruding from the outer lateral side of the stacked wafer T may have a size such that the position of the end of the outside adhesive $G_E$ after its surface is removed corresponds to the position of the end of the target wafer W after being thinned.

Also, in Operation A12, the surface of the outside adhesive $G_E$ is removed uniformly from the upper and lower sides by the solvent of the adhesive G from the upper nozzle 321 and the lower nozzle 322. That is, a distance between an upper end of the outside adhesive $G_E$ after its surface is removed (shown by an alternate long and two dashes line in FIG. 35) and the lower surface of the support wafer S is equal to a distance between the lower end of the outside adhesive $G_E$ and the target wafer W. In this way, as the surface of the outside adhesive $G_E$ is removed so that the upper and lower sides thereof are uniform, the subsequent transfer or processing of the stacked wafer T may be appropriately performed.

Further, in Operation A12, as the control unit 400 controls the spin chuck 310 to control the revolutions of the stacked wafer T, the outside adhesive $G_E$ is formed to have a predetermined size by controlling the removal amount of the surface of the outside adhesive $G_E$. In addition, the removal amount of the surface of the outside adhesive $G_E$ is also controlled according to the supply amount, supply time, supply timing, the drain amount, by the ejector 331, of the adhesive G, or the like.

The stacked wafer T, where the surface of the outside adhesive $G_E$ is removed in the adhesive removal device 41, is transferred to the transition device 51 by the wafer transfer device 61 and then transferred to the cassette $C_T$ of of a predetermined cassette mounting plate 11 by the wafer transfer device 22 of the carry-in/carry-out station 2. In this way, a series of the joining processes of the target wafer W and the support wafer S are completed.

According to the above embodiment, after the target wafer W and the support wafer S are joined in Operation A11, the surface of the outside adhesive $G_E$ protruding from the outer lateral side of the stacked wafer T is removed in Operation A12, and the outside adhesive $G_E$ may be formed to have a predetermined size. If so, the outside adhesive $G_E$ is not stuck to the wafer transfer device 61 configured to transfer the target wafer W, the support wafer S and the stacked wafer T, or processing devices configured to perform predetermined processing on the wafers W, S and T. Thus, the target wafer W and the support wafer S can be appropriately joined.

Also, in Operation A12, the outside adhesive $G_E$ is formed to have a size so that the position of its lower end corresponds to the position of the end of the target wafer W after being thinned. For this reason, the outside adhesive $G_E$ is not stuck to a device of thinning the target wafer W, which is installed outside the joining system 1, and the outer peripheral portion of the target wafer W that has been joined is not also damaged. In addition, since the surface of the outside adhesive $G_E$ is removed uniformly from the upper and lower sides in Operation A12, a subsequent stacked wafer T may be appropriately transferred or processed.

In addition, since, in Operation A12, the number of revolutions of the stacked wafer T is controlled by the spin chuck 310 and also the supply amount, supply time or supply timing of the adhesive G from the nozzles 321 and 322 or the drain amount of the adhesive G by the ejector 331 is controlled, the outside adhesive $G_E$ may be appropriately formed to have a predetermined size.

Figure 36:
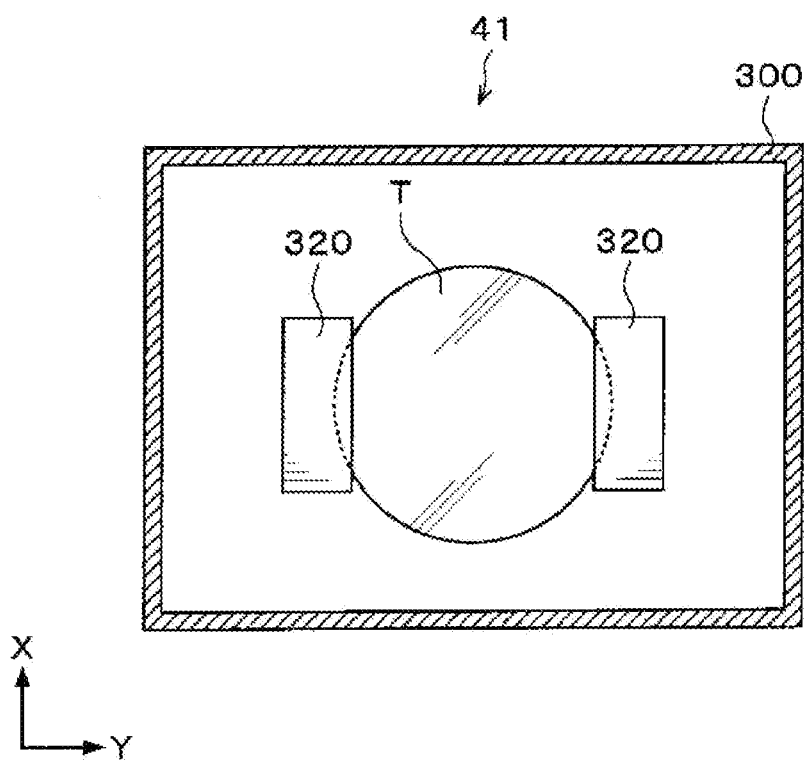
FIG. 36 is a transverse sectional view schematically showing a configuration of an adhesive removal device according to another embodiment.

As shown in FIG. 36, the solvent supply unit 320 may placed at a plurality of locations, for example, two places in the shown example, in the adhesive removal device 41 of the above embodiment. In such a case, for example, one of the solvent supply units 320 may supply the solvent of the adhesive G only from the upper side of the stacked wafer T, and the other solvent supply unit 320 may supply the solvent of the adhesive G only from the lower side of the stacked wafer T. In either case, as the plurality of solvent supply units 320 supply the solvent of the adhesive G to the outside adhesive $G_E$, the surface of the outside adhesive $G_E$ can be more efficiently removed. Therefore, it is possible to improve a throughput of the joining processing in the joining system 1.

In the above embodiment, after the target wafer W is coated with the adhesive G in Operation A1, the solvent of the adhesive G may be supplied onto the outer peripheral portion of the target wafer W to remove the adhesive G on the outer peripheral portion. Such removal of the adhesive G on the outer peripheral portion of the target wafer W may be performed before or after performing heat processing on the target wafer W in Operation A2.

Figure 37:
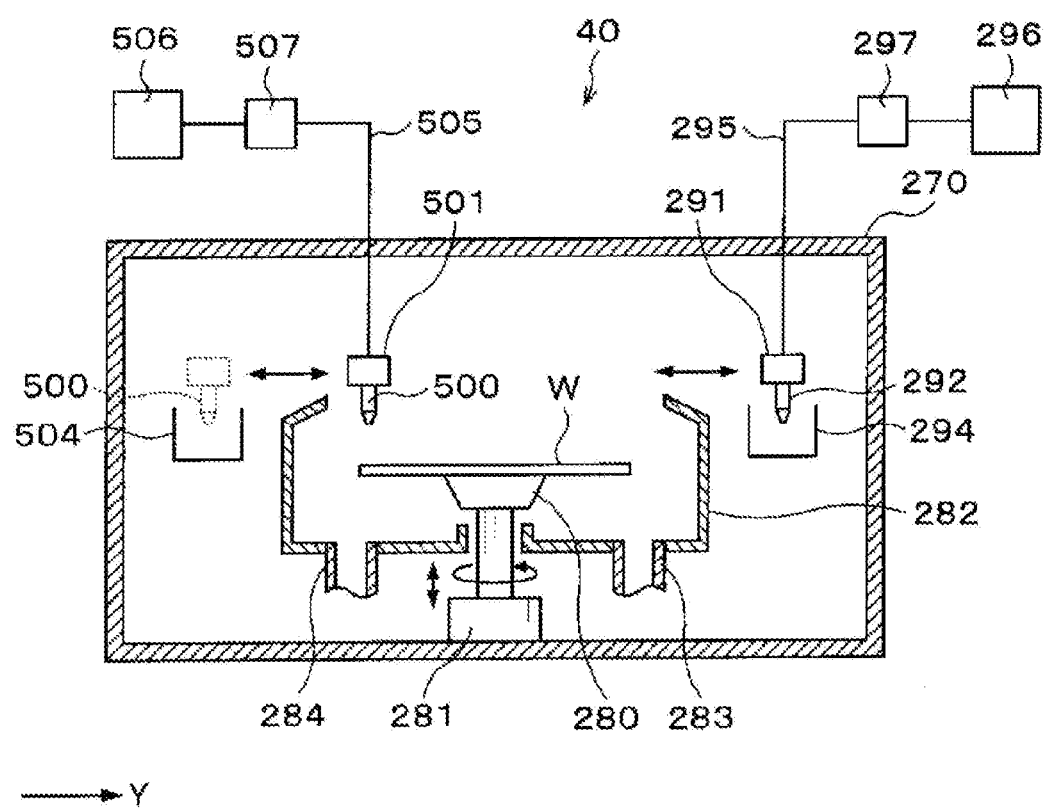
FIG. 37 is a longitudinal sectional view schematically showing a configuration of a coating device according to another embodiment.

When the removal of the adhesive G on the outer peripheral portion of the target wafer W is performed before performing the heat processing on the target wafer in Operation A2, as shown in FIG. 37, the coating device 40 has a solvent nozzle 500, as another solvent supply unit configured to supply the solvent of the adhesive G. The solvent nozzle 500 is supported by an arm 501.

Figure 38:
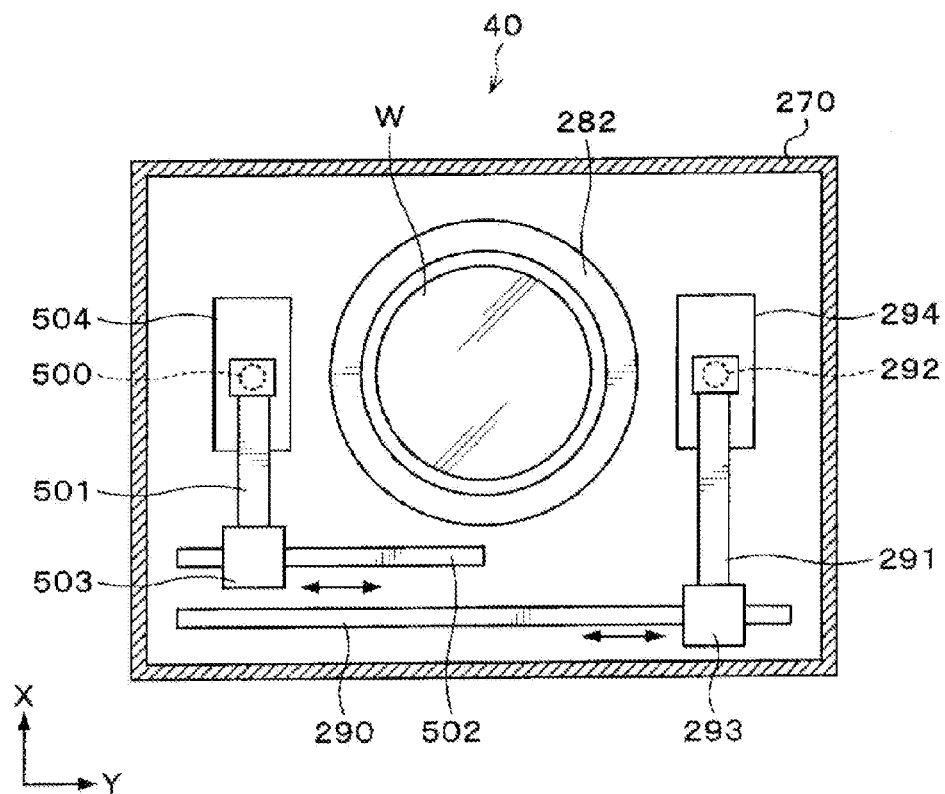
FIG. 38 is a transverse sectional view schematically showing a configuration of the coating device according to another embodiment.

As shown in FIG. 38, a rail 502 extending along a Y direction (left and right directions in FIG. 38) is formed between the cup 282 and the rail 290. The rail 502 is formed, for example, from an outer side of the cup 282 of a negative direction of a Y direction (left side in FIG. 38) to the vicinity of the center of the cup 282.

The arm 501 can be moved on the rail 502 by a nozzle drive unit 503. With this configuration, the solvent nozzle 500 can move from a standby section 504 installed at the outer side of the cup 282 in a positive direction of the Y direction to an upper side of the outer peripheral portion of the target wafer W positioned in the cup 282, and also can move over the target wafer W in diameter radial direction thereof. The arm 501 may also be liftable by the nozzle drive unit 503 to adjust the height of the solvent nozzle 500.

As shown in FIG. 37, a supply pipe 505 configured to supply the solvent of the adhesive G to the solvent nozzle 500 is connected to the solvent nozzle 500. The supply pipe 505 is in communication with a solvent supply source 506 configured to reserve the solvent of the adhesive G therein. In addition, a supply kit 507 including a valve, a flow controller or the like configured to control the flow of the solvent of the adhesive G is installed at the supply pipe 505. Also, the solvent of the adhesive G includes, for example, an organic thinner, and trimethylbenzen (mesitylene) is used in the embodiment.

In addition, the other configurations of the coating device 40 are the same as those of the coating device 40 of the above embodiment, and thus, a description thereof will be omitted.

Figure 39:
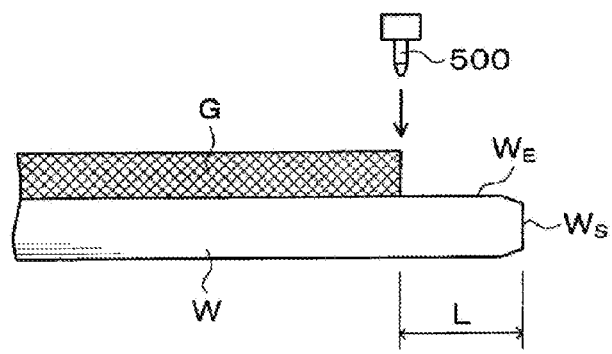
FIG. 39 is an explanatory view illustrating a state where an adhesive on an outer peripheral portion of a target wafer has been removed.
Figure 40:
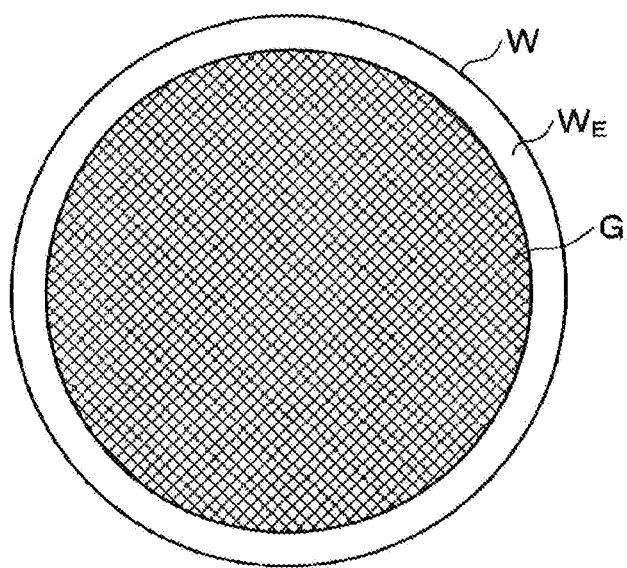
FIG. 40 is an explanatory view illustrating a state where an adhesive on an outer peripheral portion of a target wafer has been removed.

In such a case, after the target wafer W is coated with the adhesive G in Operation A1, the solvent nozzle 500 positioned in the standby section 504 is moved to an upper side of the outer peripheral portion of the target wafer W by the arm 501. Here, as shown in FIG. 39, the solvent nozzle 500 is arranged at a predetermined distance L, for example, 5 mm to 7.5 mm, from an outer lateral side $W_S$ of the target wafer W. Thereafter, while the target wafer W is rotated by the spin chuck 280, the solvent of the adhesive G is supplied to an outer peripheral portion $W_E$ of the target wafer W from the solvent nozzle 500. The supplied solvent of the adhesive G flows over the outer peripheral portion $W_E$ of the target wafer W toward the outer lateral side $W_S$ due to the centrifugal force. In addition, as shown in FIG. 40, the solvent of the adhesive G removes the adhesive G on the outer peripheral portion $W_E$ of the target wafer W.

Also, in this process, the predetermined distance L of the outer peripheral portion $W_E$ from the outer lateral side $W_S$ of the target wafer W is determined by the control unit 400, based on at least the type of the adhesive G, a target film thickness of the adhesive G applied on the target wafer W in Operation A1, the heat processing temperature at which the target wafer W is heated in Operation A2 or A11, or the pressure at which the target wafer W and the support wafer S are pressed in Operation A11.

The subsequent Operations A2 to A12 are the same as Operations A2 to A12 of the above embodiment, and thus, a description thereof will be omitted.

According to the embodiment, since the adhesive G on the outer peripheral portion $W_E$ of the target wafer W is removed in advance before the target wafer W and the support wafer S are joined in Operation A11, it is possible to prevent the outside adhesive $G_E$ from protruding from the stacked wafer T in Operation A11. Also, the surface of the protruding outside adhesive $G_E$ is removed in Operation A12. In this way, since the outside adhesive $G_E$ protruding from the stacked wafer T is adjusted in two steps, the outside adhesive $G_E$ may be more appropriately formed to have a predetermined size. Therefore, the target wafer W and the support wafer S may be more appropriately joined to each other. Also, since the target wafer W is coated with the adhesive G and the adhesive G on the outer peripheral portion $W_E$ is removed in the coating device 40, the adhesive G can be certainly prevented from being stuck to a device, such as the wafer transfer device 61, which is positioned outside the coating device 40.

In addition, when the removal of the adhesive G on the outer peripheral portion of the target wafer W is performed after the heat processing in Operation A2, as shown in FIG. 41, another adhesive removal device 510 is stacked on the adhesive removal device 41 in the second processing block G2 of the joining system 1. The other adhesive removal device 510 has a configuration in which the adhesive nozzle 292 and its attendant members 290, 291 and 294 to 297 are omitted from the above-described coating device 40 and the solvent nozzle 500 and its attendant members 501 to 507 are installed thereto.

In such a case, after the target wafer W is coated with the adhesive G in Operation A1 and the target wafer W is heated at the predetermined temperature in Operation A2, the outer peripheral portion $W_E$ of the target wafer W is supplied with the solvent of the adhesive G through the solvent nozzle 500. Then, the solvent of the adhesive G removes the adhesive G on the outer peripheral portion $W_E$ of the target wafer W. In addition, the process of removing the adhesive G on the outer peripheral portion $W_E$ is the same as that of the above embodiment, and thus, a description thereof will be omitted. Also, the subsequent Operations A3 to A12 are the same as Operations A3 to A12 of the above embodiment, and thus, a description thereof will be omitted.

With the embodiment, since the outside adhesive $G_E$ protruding from the stacked wafer T is adjusted in two steps by removing the adhesive G of the outer peripheral portion $W_E$ after Operation A2 and removing the surface of the outside adhesive $G_E$ in Operation A12, it is possible to more appropriately form the outside adhesive $G_E$ to have a predetermined size. In addition, since the adhesive G on the outer peripheral portion $W_E$ of the target wafer W is removed after the adhesive G is heated and cured, the adhesive G can be removed with high precision.

In the above embodiments, although the target wafer W and the support wafer S are joined to each other in a state where the target wafer W is arranged in the lower side and the support wafer S is arranged in the upper side, the upper and lower arrangement of the target wafer W and support wafer S may be reversed. In such a case, the above-described Operations A1 to A5 are performed on the support wafer S, and the joint surface $S_J$ of the support wafer S is coated with the adhesive G. In addition, the above-described Operations A5 to A7 are performed on the target wafer W, and then, the front and rear surfaces of the target wafer W are reversed. Thereafter, the above-described Operations A8 to A12 are performed to join the support wafer S and the target wafer W to each other. However, in order to protect electric circuits and the like on the target wafer W, the target wafer W can be coated with the adhesive G.

In addition, although it has been described in the above embodiments that any one of the target wafer W and the support wafer S is coated with the adhesive G in the coating device 40, both the target wafer W and the support wafer S may be coated with the adhesive G.

Although it has been described in the above embodiments that the target wafer W is heated at a predetermined temperature of 100 to 300 degrees C. in Operation A2, the target wafer W may be heat-processed in two steps. For example, the target wafer W is heated at a first heat processing temperature of, for example, 100 to 150 degrees C., in the heat processing device 42, and then heated at a second heat processing temperature of, for example, 150 to 300 degrees C., in the heat processing device 45. In such a case, the temperature of each heating mechanism in the heat processing devices 42 and 45 may be maintained constant. Therefore, since the temperature of the heating mechanism need not be adjusted, a throughput of the joining processing of the target wafer W and the support wafer S can be more improved.

Although embodiments of the present disclosure have been described above with reference to the accompanying drawings, the present disclosure is not limited to the embodiments. It should be understood that various changes and modifications are readily apparent to those skilled in the art within the scope of the spirit as set forth in the claims, and those should also be covered by the technical scope of the present disclosure. The present disclosure is not limited to the embodiments but can take various aspects. The present disclosure may be applied to other various substrates including an FPD (flat panel display), a mask reticle for a photomask and so on, in addition to the wafers.

What is claimed is:

1. A method of joining a target substrate and a support substrate, comprising:
   a joining operation that includes pressing and joining the target substrate and the support substrate by interposing an adhesive;
   an adhesive removing operation that includes supplying a solvent of the adhesive to an outside adhesive that is the adhesive between the target substrate and the support substrate protruding in the joining operation from an outer lateral side of a stacked substrate made by joining the target substrate and the support substrate, to remove a portion of the outside adhesive; and
   a thinning operation that includes thinning the target substrate,
   wherein in the adhesive removing operation, a surface of the outside adhesive is removed so that an end of the outside adhesive reaches a predetermined position, and in the thinning operation, the target substrate is thinned so that an end of the target substrate reaches the predetermined position.

2. The method of claim 1, wherein, in the adhesive removing operation, the solvent of the adhesive is supplied from a side of the target substrate and a side of the support substrate of the outside adhesive.

3. The method of claim 1, wherein, in the adhesive removing operation, the outside adhesive is supplied with the solvent of the adhesive while the stacked substrate is rotated.

4. The method of claim 3, wherein, in the adhesive removing operation, a removal amount of the surface of the outside adhesive is adjusted by controlling the number of revolutions of the stacked substrate.

5. The method of claim 3, wherein, in the adhesive removing operation, the solvent of the adhesive is supplied to the outside adhesive from a plurality of places as viewed from the top.

6. The method of claim 1, wherein, in the adhesive removing operation, the solvent of the adhesive after the surface of the outside adhesive is removed is forcibly drained.

7. The method of claim 1, further comprising:
   an adhesive coating operation that includes coating the target substrate or the support substrate with the adhesive, before the joining operation; and
   an additional adhesive removing operation that includes supplying the solvent of the adhesive onto an outer peripheral portion of the target substrate or the support substrate coated with the adhesive to remove the adhesive on the outer peripheral portion, after the adhesive coating operation and before the joining operation.

8. The method of claim 7, further comprising a heating operation that includes heating the target substrate or the support substrate, which is coated with the adhesive and has the adhesive on the outer peripheral portion removed, at a predetermined temperature after the additional adhesive removing operation and before the joining operation.

9. The method of claim 7, further comprising a heating operation that includes heating the target substrate or the support substrate coated with the adhesive at a predetermined temperature after the adhesive coating operation and before the additional adhesive removing operation.

* * * * *